(12) United States Patent
Xi et al.

(10) Patent No.: US 11,949,440 B2
(45) Date of Patent: Apr. 2, 2024

(54) MULTI-USER INTERLEAVING AND MODULATION IN A WIRELESS NETWORK

(71) Applicant: InterDigital Patent Holdings, Inc., Wilmington, DE (US)

(72) Inventors: Fengjun Xi, San Diego, CA (US); Yuan Sheng Jin, Santa Clara, CA (US); Pengfei Xia, San Diego, CA (US); Oghenekome Oteri, San Diego, CA (US); Hanqing Lou, Syosset, NY (US); Nirav B. Shah, San Diego, CA (US); Robert L. Olesen, Huntington, NY (US)

(73) Assignee: InterDigital Patent Holdings, Inc., Wilmington, DE (US)

( * ) Notice: Subject to any disclaimer, the term of this patent is extended or adjusted under 35 U.S.C. 154(b) by 0 days.

(21) Appl. No.: 17/094,552

(22) Filed: Nov. 10, 2020

(65) Prior Publication Data
US 2021/0058101 A1    Feb. 25, 2021

Related U.S. Application Data

(63) Continuation of application No. 16/415,680, filed on May 17, 2019, now Pat. No. 10,833,712, which is a
(Continued)

(51) Int. Cl.
*H04B 1/02*    (2006.01)
*H03M 13/27*    (2006.01)
(Continued)

(52) U.S. Cl.
CPC .............. *H04B 1/02* (2013.01); *H03M 13/27* (2013.01); *H03M 13/2707* (2013.01);
(Continued)

(58) Field of Classification Search
CPC .... H04B 1/02; H03M 13/27; H03M 13/2707; H04L 1/00; H04L 1/0006; H04L 1/0025;
(Continued)

(56) References Cited

U.S. PATENT DOCUMENTS 7,233,612 B1 *   6/2007   Zhang ................. H04L 27/2647
                                                                714/763
7,660,232 B2 *   2/2010   Ouyang .............. H04L 27/2608
                                                                  370/208
(Continued)

OTHER PUBLICATIONS

Chiueh et al., "OFDM Baseband Receiver Design for Wireless Communications", John Wiley and Sons (Asia) Pte Ltd, 2007, 240 pages.
(Continued)

*Primary Examiner* — Hoang-Chuong Q Vu
(74) *Attorney, Agent, or Firm* — Volpe Koenig P.C.

(57) ABSTRACT

A wireless transmit/receive unit (WTRU) may receive a constellation symbol that includes indications that each are associated with a respective WTRU of a plurality of WTRUs. The WTRU may determine that a first weight associated with a first indication of the indications is different than a second weight associated with a second indication of the indications. The indications may comprise indications of bits modulated at a multi-user constellation bit division multiple access modulator (MU-CBDMAM).

11 Claims, 18 Drawing Sheets

Related U.S. Application Data continuation of application No. 15/516,597, filed as application No. PCT/US2015/053752 on Oct. 2, 2015, now Pat. No. 10,312,950.

(60) Provisional application No. 62/059,828, filed on Oct. 3, 2014.

(51) Int. Cl.
| | |
|---|---|
| *H04L 1/00* | (2006.01) |
| *H04L 1/16* | (2006.01) |
| *H04L 1/1607* | (2023.01) |
| *H04L 1/20* | (2006.01) |
| *H04L 5/00* | (2006.01) |
| *H04W 84/12* | (2009.01) |

(52) U.S. Cl.
CPC .............. *H04L 1/00* (2013.01); *H04L 1/0006* (2013.01); *H04L 1/0025* (2013.01); *H04L 1/0026* (2013.01); *H04L 1/0071* (2013.01); *H04L 1/1671* (2013.01); *H04L 1/20* (2013.01); *H04L 5/00* (2013.01); *H04W 84/12* (2013.01)

(58) Field of Classification Search
CPC ... H04L 1/0026; H04L 1/0071; H04L 1/1671; H04L 1/20; H04L 5/00; H04W 84/12
See application file for complete search history.

(56) References Cited

U.S. PATENT DOCUMENTS

| | | | | |
|---|---|---|---|---|
| 7,711,060 | B1* | 5/2010 | Lou ................. | H04L 1/0071 375/267 |
| 9,118,530 | B2* | 8/2015 | Srinivasa ............. | H04L 1/0005 |
| 9,729,371 | B2* | 8/2017 | Zhang ................. | H04L 27/2603 |
| 2004/0208251 | A1 | 10/2004 | Learned et al. | |
| 2005/0141628 | A1 | 6/2005 | Cheng | |
| 2006/0093059 | A1* | 5/2006 | Skraparlis ............. | H04L 1/0625 375/267 |
| 2006/0227892 | A1* | 10/2006 | Ouyang ................ | H04L 5/0023 375/267 |
| 2007/0025463 | A1* | 2/2007 | Aldana ................ | H04B 7/0684 375/267 |
| 2007/0172000 | A1 | 7/2007 | Hamamoto et al. | |
| 2007/0202816 | A1* | 8/2007 | Zheng ................. | H04L 5/0037 455/91 |
| 2008/0095223 | A1* | 4/2008 | Tong .................. | H04L 25/0224 375/228 |
| 2008/0267316 | A1 | 10/2008 | Golitschek Edler Von Elbwart et al. | |
| 2008/0279322 | A1* | 11/2008 | Franovici ............ | H04L 25/0208 375/371 |
| 2009/0016312 | A1* | 1/2009 | Tao ................... | H04B 7/0874 370/344 |
| 2009/0022242 | A1* | 1/2009 | Waters ................. | H04L 1/0041 375/299 |
| 2009/0041092 | A1 | 2/2009 | Kim et al. | |
| 2009/0042511 | A1 | 2/2009 | Malladi | |
| 2009/0060094 | A1 | 3/2009 | Jung et al. | |
| 2009/0285342 | A1* | 11/2009 | Suh ................... | H04L 25/03254 375/346 |
| 2009/0296574 | A1* | 12/2009 | Liao .................... | H04W 52/343 370/230 |
| 2010/0040170 | A1 | 2/2010 | Qu et al. | |
| 2010/0040171 | A1 | 2/2010 | Qu et al. | |
| 2010/0046414 | A1* | 2/2010 | Sundaresan ......... | H04W 72/542 370/329 |
| 2010/0046445 | A1* | 2/2010 | Sawahashi ............ | H04L 5/0037 455/507 |
| 2010/0074237 | A1* | 3/2010 | Ahn ..................... | H04W 52/42 455/522 |
| 2010/0093384 | A1* | 4/2010 | Chun ................... | H04L 5/0041 455/509 |
| 2010/0309834 | A1 | 12/2010 | Fischer et al. | |
| 2011/0002219 | A1 | 1/2011 | Kim et al. | |
| 2011/0002371 | A1 | 1/2011 | Forenza et al. | |
| 2011/0141876 | A1* | 6/2011 | Kuchi ................. | H04L 27/2636 375/267 |
| 2011/0255467 | A1 | 10/2011 | Larsson | |
| 2011/0255582 | A1 | 10/2011 | Prasad et al. | |
| 2012/0027005 | A1* | 2/2012 | Haustein .............. | H04B 7/0617 370/344 |
| 2012/0063429 | A1* | 3/2012 | Yang ..................... | H04L 1/0041 370/338 |
| 2012/0093249 | A1 | 4/2012 | Sun et al. | |
| 2012/0121030 | A1 | 5/2012 | Luo et al. | |
| 2012/0189082 | A1 | 7/2012 | Zhang et al. | |
| 2012/0201192 | A1 | 8/2012 | Hong et al. | |
| 2012/0236970 | A1 | 9/2012 | Schlegel et al. | |
| 2012/0263081 | A1 | 10/2012 | Li et al. | |
| 2013/0114437 | A1 | 5/2013 | Yoo et al. | |
| 2013/0229996 | A1 | 9/2013 | Wang et al. | |
| 2013/0286959 | A1 | 10/2013 | Lou et al. | |
| 2014/0003547 | A1* | 1/2014 | Williams ............ | H04L 27/2647 375/267 |
| 2015/0023335 | A1* | 1/2015 | Vermani ................ | H04L 27/26 370/338 |
| 2015/0029979 | A1* | 1/2015 | Onodera ............. | H04W 72/121 370/329 |
| 2015/0263796 | A1* | 9/2015 | Nam ..................... | H04L 5/0094 370/329 |
| 2015/0271003 | A1* | 9/2015 | Kuchi ................. | H04L 27/2649 370/329 |
| 2015/0349995 | A1* | 12/2015 | Zhang ................. | H04L 27/2602 375/295 |
| 2015/0365195 | A1* | 12/2015 | Yang ................. | H03M 13/6508 375/295 |
| 2015/0365266 | A1* | 12/2015 | Zhang ................. | H04L 27/2605 370/329 |
| 2016/0029397 | A1* | 1/2016 | Chen .................. | H04W 72/042 370/329 |
| 2016/0037550 | A1 | 2/2016 | Barabell et al. | |
| 2016/0142120 | A1* | 5/2016 | Li ....................... | H04L 27/3444 375/267 |
| 2016/0255656 | A1 | 9/2016 | Lou et al. | |
| 2019/0068418 | A1* | 2/2019 | Zhang ................. | H04L 27/2602 |

OTHER PUBLICATIONS

Choi et al., "Discussion on OFDMA in HEW," IEEE 802.11-13/1382r0 (Nov. 2013).

Daniels et al., "Link Adaptation in MIMO-OFDM with Non-Uniform Constellation Selection Over Spatial Streams Through Supervised Learning", Acoustics Speech and Signal Processing (ICASSP), 2010 IEEE International, Mar. 14, 2010, pp. 3314-3317.

IEEE P802.11ah/D2.1, Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Sub 1 GHz License Exempt Operation, IEEE P802.11ah/D2.1 (Aug. 2014).

IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 5: Enhancements for Higher Throughput, IEEE Std 802.11n-2009 (Sep. 2009).

IEEE Standard for Information technology—Telecommunications and information exchange between systems—Local and metropolitan area networks—Specific requirements; Part 11: Wireless LAN Medium Access Control (MAC) and Physical Layer (PHY) Specifications; Amendment 4: Enhancements for Very High Throughput for Operation in Bands below 6GHz, IEEE Std 802.11ac-2013 (Dec. 11, 2013).

IEEE, "IEEE Draft Standard for IT—Telecommunications and Information Exchange Between Systems—LAN/MAN—Specific Requirements—Part 11: Wireless LAN Medium Access Control and Physical Layer Specifications, Amendment 5: Enhancements for

(56) References Cited

OTHER PUBLICATIONS

Very High Throughput for Operation in Bands below 6GHz", IEEE P802.11ac/D2.0, Jan. 2012, pp. 1-359.

IEEE, "IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications", IEEE Computer Society, IEEE Std 802.11™-2012, Mar. 29, 2012, 2793 pages.

IEEE, "IEEE Standard For Information Technology—Telecommunications and Information Exchange Between Systems—Local and Metropolitan Area Networks—Specific Requirements, Part 11: Wireless LAN Medium Access Control (MAC) and Physical Layer (PHY) Specifications", IEEE P802.11-REVmb™/D12, Nov. 2011, 2910 pages.

IEEE, "IEEE Standard For Information Technology—Telecommunications and Information Exchange Between Systems—Local and Metropolitan Area Networks—Specific Requirements, Part 11, Wireless LAN Medium Access Control (MAC) and Physical Layer (PHY) Specifications. Amendment 3: TV White Spaces Operation", IEEE P802.11af(TM)/01.02, Jun. 2011, 157 pages.

IEEE, "Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Amendment—Sub 1 GHz License-Exempt Operation", IEEE Computer Society/LAN/MAN Standards Committee (C/LM), P802.11ah, 2010, 2 pages.

Methods for Multi-User Parallel Channel Access in WLAN Systems.

Supplement to IEEE Standard for Information technology—Telecommunications and information exchange between systems—Local and metropolitan area networks—Specific requirements; Part 11: Wireless LAN Medium Access Control (MAC) and Physical Layer (PHY) Specifications; High-speed Physical Layer in the 5GHz Band, IEEE Std. 802.11-1999 (R2003) (Jun. 12, 2003).

Third Generation Partnership Project, "Technical Specification Group Radio Access Network Evolved Universal Terrestrial Radio Access (E-UTRA); Physical channels and modulation (Release 12)," 3GPP TS 36.211 V12.3.0 (Sep. 2014).

Third Generation Partnership Project, "Technical Specification Group Radio Access Network Evolved Universal Terrestrial Radio Access (E-UTRA); Physical channels and modulation (Release 12)," 3GPP TS 36.211 V12.7.0 (Sep. 2015).

\* cited by examiner

| | Write (W) → | | |
|---|---|---|---|
| 0 | 1 | ... | $N_U - 1$ |
| $N_U$ | $N_U + 1$ | ... | $2N_U - 1$ |
| ... | ... | ... | ... |
| ... | ... | ... | ... |
| ... | ... | ... | ... |
| $(N_{BPSCS} - 1)N_U$ | $(N_{BPSCS} - 1)N_U + 1$ | ... | $N_{BPSCS}N_U - 1$ |

Read (R) ↓ , $N_{row} = N_{BPSCS}$, $N_{col} = N_U$

MULTI-USER INTERLEAVING AND MODULATION IN A WIRELESS NETWORK

CROSS-REFERENCE TO RELATED APPLICATIONS

This application is a continuation of U.S. patent application Ser. No. 16/415,680 filed on May 17, 2019, which issues on Nov. 10, 2020 as U.S. Pat. No. 10,833,712, which is a continuation of U.S. patent application Ser. No. 15/516,597 filed on Apr. 3, 2017, which issued on Jun. 4, 2019 as U.S. Pat. No. 10,312,950, which is the U.S. National Stage, under 35 U.S.C. § 371, of International Application No. PCT/US2015/053752 filed Oct. 2, 2015, which claims the benefit of U.S. Provisional Patent Application No. 62/059,828 filed on Oct. 3, 2014, the entire contents of which are hereby incorporated by reference herein.

BACKGROUND

In recent years, wireless devices such as smart phones, tablet computers, etc. have proliferated with the increased availability of larger bandwidth wireless connections to networks such as the Internet. Such devices often use wireless local access network (WLAN) systems for network access. WLAN systems may utilize multiple channel widths. For example, various channel widths are supported by systems described in Institute of Electrical and Electronics Engineers (IEEE) standards 802.11n, 802.11ac, 802.11af, and 802.11ah.

SUMMARY

Methods, systems, and apparatuses are disclosed for transmitting a plurality of bits to an access point (AP) and receiving constellation symbol from the AP, where the constellation symbol may include a plurality of indications of, for example, a set of bits. A constellation symbol may be associated with a uniform constellation or a non-uniform constellation. Each indication may be associated with one or more wireless transmit/receive units (WTRUs). The indications of bits may be generated by modulation at a multi-user constellation bit division multiple access modulator (MU-CBDMAM). A MU-CBDMAM may operate as an open loop MU-CBDMAM or a closed loop MU-CBDMAM, and may switch between these methods of operation. Feedback may be transmitted by a WTRU in, e.g., a feedback control frame, to, e.g., an AP. Feedback may include one or more of an acknowledgement (ACK), an indicator of channel state information (CSI), and an indication of a signal-to-noise ratio (SNR).

DETAILED DESCRIPTION

A detailed description of illustrative examples will now be described with reference to the various figures. Although this description provides a detailed example of possible implementations, it should be noted that the details are intended as illustrative examples only and in no way limit the scope of the application.

Figure 1A:
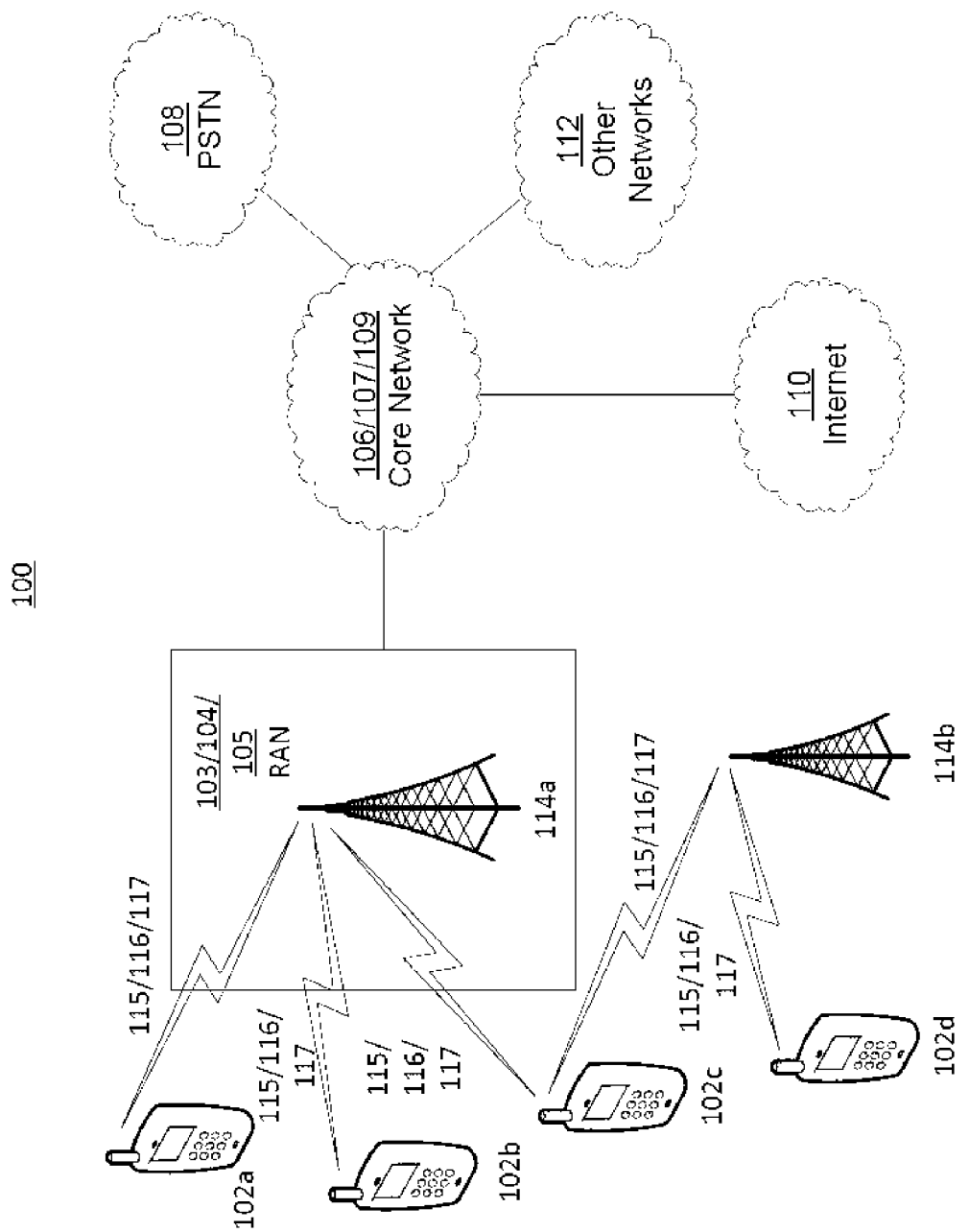
FIG. 1A is a system diagram of an example communications system in which the disclosed subject matter may be implemented.

FIG. 1A is a diagram of an example communications system 100 in which one or more disclosed features may be implemented. For example, a wireless network (e.g., a wireless network comprising one or more components of the communications system 100) may be configured such that bearers that extend beyond the wireless network (e.g., beyond a walled garden associated with the wireless network) may be assigned QoS characteristics.

The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), and the like.

As shown in FIG. 1A, the communications system 100 may include at least one wireless transmit/receive unit (WTRU), such as a plurality of WTRUs, for instance WTRUs 102a, 102b, 102c, and 102d, a radio access network (RAN) 104, a core network 106, a public switched telephone network (PSTN) 108, the Internet 110, and other networks 112, though it should be appreciated that the disclosed subject matter contemplates any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d may be configured to transmit and/or receive wireless signals and may include user equipment (UE), a mobile station, a fixed or mobile subscriber unit, a pager, a cellular telephone, a personal digital assistant (PDA), a smartphone, a laptop, a netbook, a personal computer, a wireless sensor, consumer electronics, and the like.

The communications systems 100 may also include a base station 114a and a base station 114b. Each of the base stations 114a, 114b may be any type of device configured to wirelessly interface with at least one of the WTRUs 102a, 102b, 102c, 102d to facilitate access to one or more communication networks, such as the core network 106, the Internet 110, and/or the networks 112. By way of example, the base stations 114a, 114b may be a base transceiver station (BTS), a Node-B, an eNode B, a Home Node B, a Home eNode B, a site controller, an access point (AP), a wireless router, and the like. While the base stations 114a, 114b are each depicted as a single element, it should be appreciated that the base stations 114a, 114b may include any number of interconnected base stations and/or network elements.

The base station 114a may be part of the RAN 104, which may also include other base stations and/or network elements (not shown), such as a base station controller (BSC), a radio network controller (RNC), relay nodes, etc. The base station 114a and/or the base station 114b may be configured to transmit and/or receive wireless signals within a particular geographic region, which may be referred to as a cell (not shown). The cell may further be divided into cell sectors. For example, the cell associated with the base station 114a may be divided into three sectors. Thus, in one example, the base station 114a may include three transceivers, e.g., one for each sector of the cell. In another example, the base station 114a may employ multiple-input multiple output (MIMO) technology and, therefore, may utilize multiple transceivers for each sector of the cell.

The base stations 114a, 114b may communicate with one or more of the WTRUs 102a, 102b, 102c, 102d over an air interface 116, which may be any suitable wireless communication link (e.g., radio frequency (RF), microwave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104 and the WTRUs 102a, 102b, 102c may implement a radio technology such as Universal Mobile Telecommunications System (UMTS) Terrestrial Radio Access (UTRA), which may establish the air interface 116 using wideband CDMA (WCDMA). WCDMA may include communication protocols such as High-Speed Packet Access (HSPA) and/or Evolved HSPA (HSPA+). HSPA may include High-Speed Downlink Packet Access (HSDPA) and/or High-Speed Uplink Packet Access (HSUPA).

In another example, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A).

In other examples, the base station 114a and the WTRUs 102a, 102b, 102c may implement radio technologies such as IEEE 802.16 (e.g., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, and the like. In one example, the base station 114b and the WTRUs 102c, 102d may implement a radio technology such as IEEE 802.11 to establish a wireless local area network (WLAN). In another example, the base station 114b and the WTRUs 102c, 102d may implement a radio technology such as IEEE 802.15 to establish a wireless personal area network (WPAN). In yet another example, the base station 114b and the WTRUs 102c, 102d may utilize a cellular-based RAT (e.g., WCDMA, CDMA2000, GSM, LTE, LTE-A, etc.) to establish a picocell or femtocell. As shown in FIG. 1A, the base station 114b may have a direct connection to the Internet 110. Thus, the base station 114b may not be required to access the Internet 110 via the core network 106.

The RAN 104 may be in communication with the core network 106, which may be any type of network configured to provide voice, data, applications, and/or voice over internet protocol (VoIP) services to one or more of the WTRUs 102a, 102b, 102c, 102d. For example, the core network 106 may provide call control, billing services, mobile location-based services, pre-paid calling, Internet connectivity, video distribution, etc., and/or perform high-level security functions, such as user authentication. Although not shown in FIG. 1A, it should be appreciated that the RAN 104 and/or the core network 106 may be in direct or indirect communication with other RANs that employ the same RAT as the RAN 104 or a different RAT. For example, in addition to being connected to the RAN 104, which may be utilizing an E-UTRA radio technology, the core network 106 may also be in communication with another RAN (not shown) employing a GSM radio technology.

The core network 106 may also serve as a gateway for the WTRUs 102a, 102b, 102c, 102d to access the PSTN 108, the Internet 110, and/or other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and the internet protocol (IP) in the TCP/IP internet protocol suite. The networks 112 may include wired or wireless communications networks owned and/or operated by other service providers. For example, the networks 112 may include another core network connected to one or more RANs, which may employ the same RAT as the RAN 104 or a different RAT.

Some or all of the WTRUs 102a, 102b, 102c, 102d in the communications system 100 may include multi-mode capabilities, e.g., the WTRUs 102a, 102b, 102c, 102d may include multiple transceivers for communicating with different wireless networks over different wireless links. For example, the WTRU 102c shown in FIG. 1A may be configured to communicate with the base station 114a, which may employ a cellular-based radio technology, and with the base station 114b, which may employ an IEEE 802 radio technology.

Figure 1B:
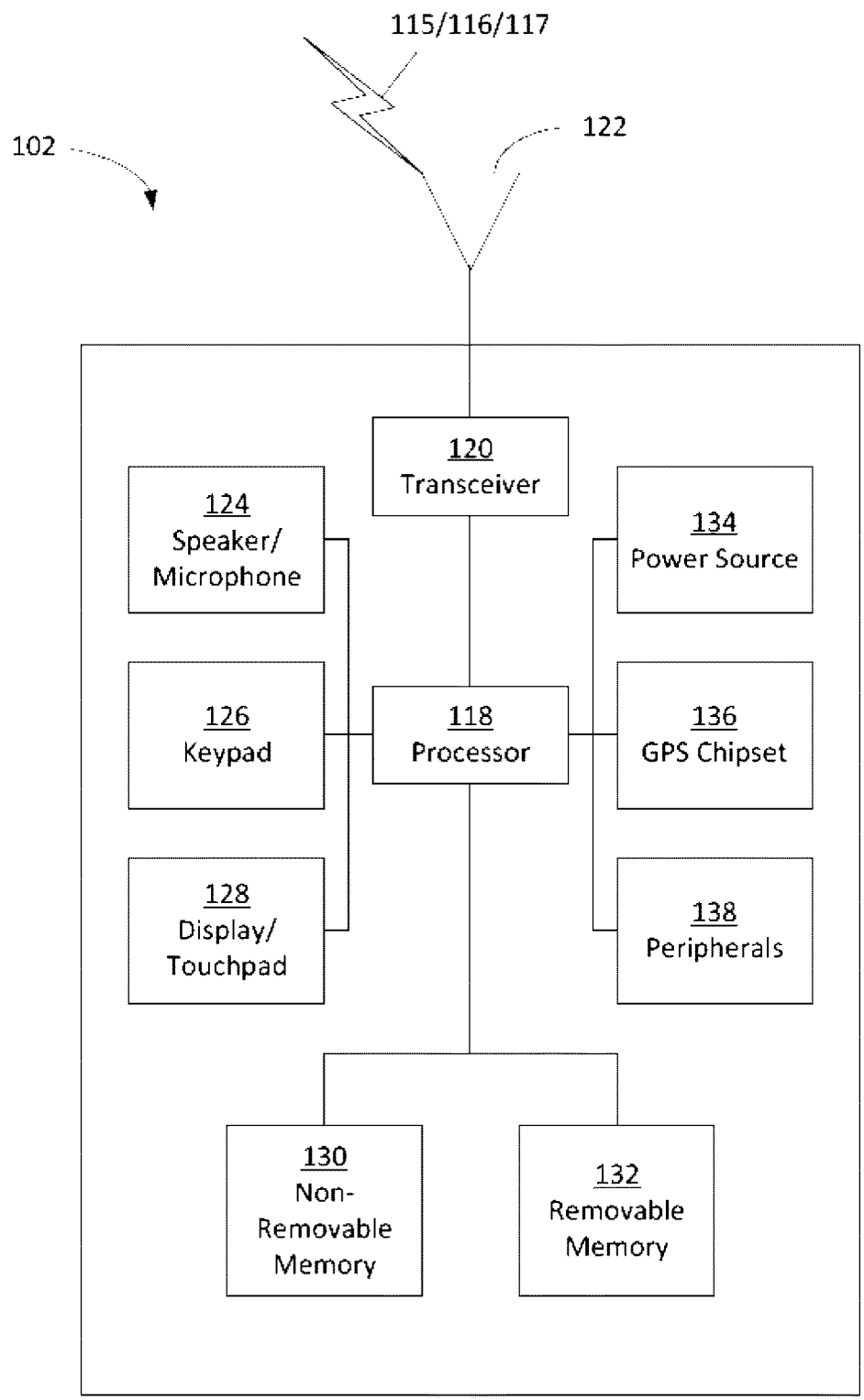
FIG. 1B is a system diagram of an example wireless transmit/receive unit (WTRU) that may be used within the communications system illustrated in FIG. 1A.

FIG. 1B depicts an exemplary wireless transmit/receive unit, WTRU 102. WTRU 102 may be used in one or more of the communications systems described herein. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and other peripherals 138. It should be appreciated that the WTRU 102 may include any sub-combination of the foregoing elements while remaining consistent with the disclosed subject matter.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Array (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it should be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one example, the transmit/receive element 122 may be an antenna configured to transmit and/or receive RF signals. In another example, the transmit/receive element 122 may be an emitter/detector configured to transmit and/or receive IR, UV, or visible light signals, for example. In yet another example, the transmit/receive element 122 may be configured to transmit and receive both RF and light signals. It should be appreciated that the transmit/receive element 122 may be configured to transmit and/or receive any combination of wireless signals.

In addition, although the transmit/receive element 122 is depicted in FIG. 1B as a single element, the WTRU 102 may include any number of transmit/receive elements 122. More specifically, the WTRU 102 may employ MIMO technology. Thus, in one example, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as UTRA and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other examples, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It should be appreciated that the WTRU 102 may acquire location information by way of any suitable location-determination method while remaining consistent with an example.

The processor 118 may further be coupled to other peripherals 138, which may include one or more software and/or hardware modules that provide additional features, functionality, and/or wired or wireless connectivity. For example, the peripherals 138 may include an accelerometer, an e-compass, a satellite transceiver, a digital camera (for photographs or video), a universal serial bus (USB) port, a vibration device, a television transceiver, a hands free headset, a Bluetooth© module, a frequency modulated (FM) radio unit, a digital music player, a media player, a video game player module, an Internet browser, and the like.

Figure 1C:
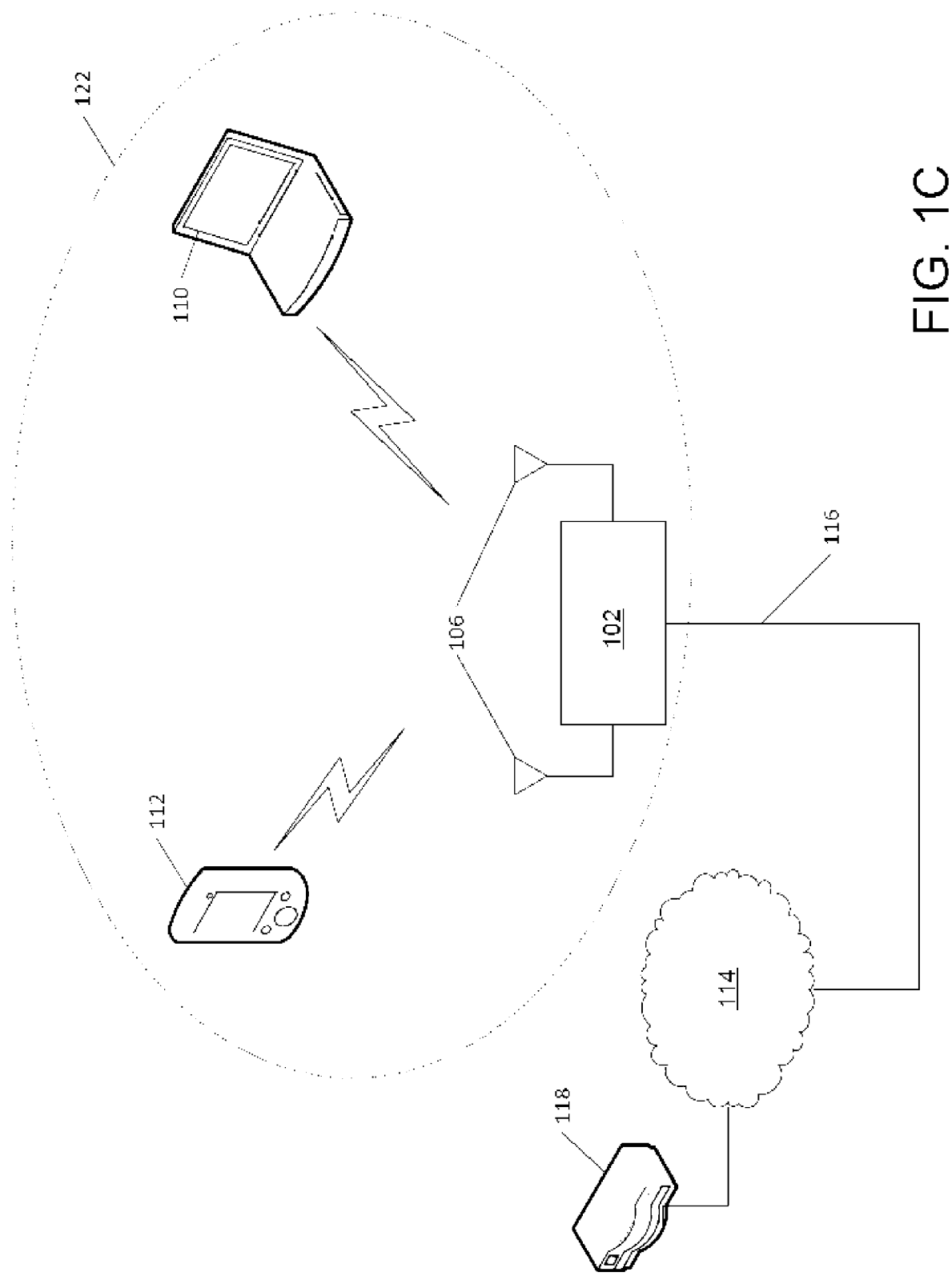
FIG. 1C is a system diagram of a non-limiting, exemplary Wi-Fi communications system.

FIG. 1C illustrates exemplary wireless local area network (WLAN) devices. One or more of the devices may be used to implement one or more of the features described herein. The WLAN may include, but is not limited to, access point (AP) 102, station (STA) 110, and STA 112. STA 110 and 112 may be associated with AP 102. The WLAN may be configured to implement one or more protocols of the IEEE 802.11 communication standard, which may include a channel access scheme, such as DSSS, OFDM, OFDMA, etc. A WLAN may operate in a mode, e.g., an infrastructure mode, an ad-hoc mode, etc.

A WLAN operating in an infrastructure mode may comprise one or more APs communicating with one or more associated STAs. An AP and STA(s) associated with the AP may comprise a basic service set (BSS). For example, AP 102, STA 110, and STA 112 may comprise BSS 122. An extended service set (ESS) may comprise one or more APs (with one or more BSSs) and STA(s) associated with the APs. An AP may have access to, and/or interface to, distribution system (DS) 116, which may be wired and/or wireless and may carry traffic to and/or from the AP. Traffic to a STA in the WLAN originating from outside the WLAN may be received at an AP in the WLAN, which may send the traffic to the STA in the WLAN. Traffic originating from a STA in the WLAN to a destination outside the WLAN, e.g., to server 118, may be sent to an AP in the WLAN, which may send the traffic to the destination, e.g., via DS 116 to network 114 to be sent to server 118. Traffic between STAs within the WLAN may be sent through one or more APs. For example, a source STA (e.g., STA 110) may have traffic intended for a destination STA (e.g., STA 112). STA 110 may send the traffic to AP 102, and, AP 102 may send the traffic to STA 112.

A WLAN may operate in an ad-hoc mode. The ad-hoc mode WLAN may be referred to as independent basic service set (IBBS). In an ad-hoc mode WLAN, the STAs may communicate directly with each other (e.g., STA 110 may communicate with STA 112 without such communication being routed through an AP).

IEEE 802.11 devices (e.g., IEEE 802.11 APs in a BSS) may use beacon frames to announce the existence of a WLAN network. An AP, such as AP 102, may transmit a beacon on a channel, e.g., a fixed channel, such as a primary channel. A STA may use a channel, such as the primary channel, to establish a connection with an AP.

STA(s) and/or AP(s) may use a Carrier Sense Multiple Access with Collision Avoidance (CSMA/CA) channel access mechanism. In CSMA/CA a STA and/or an AP may sense the primary channel. For example, if a STA has data to send, the STA may sense the primary channel. If the primary channel is detected to be busy, the STA may back off. For example, a WLAN or portion thereof may be configured so that one STA may transmit at a given time, e.g., in a given BSS. Channel access may include RTS and/or CTS signaling. For example, an exchange of a request to send (RTS) frame may be transmitted by a sending device and a clear to send (CTS) frame that may be sent by a receiving device. For example, if an AP has data to send to a STA, the AP may send an RTS frame to the STA. If the STA is ready to receive data, the STA may respond with a CTS frame. The CTS frame may include a time value that may alert other STAs to hold off from accessing the medium while the AP initiating the RTS may transmit its data. On receiving the CTS frame from the STA, the AP may send the data to the STA.

A device may reserve spectrum via a network allocation vector (NAV) field. For example, in an IEEE 802.11 frame, the NAV field may be used to reserve a channel for a time period. A STA that wants to transmit data may set the NAV to the time for which it may expect to use the channel. When a STA sets the NAV, the NAV may be set for an associated WLAN or subset thereof (e.g., a BSS). Other STAs may count down the NAV to zero. When the counter reaches a value of zero, the NAV functionality may indicate to the other STA that the channel is now available.

The devices in a WLAN, such as an AP or STA, may include one or more of the following: a processor, a memory, a radio receiver and/or transmitter (e.g., that may be combined in a transceiver), one or more antennas (e.g., antennas 106 in FIG. 1C), etc. A processor function may comprise one or more processors. For example, the processor may comprise one or more of: a general purpose processor, a special purpose processor (e.g., a baseband processor, a MAC processor, etc.), a digital signal processor (DSP), Application Specific Integrated Circuits (ASICs), Field Programmable Gate Array (FPGAs) circuits, any other type of integrated circuit (IC), a state machine, and the like. The one or more processors may be integrated or not integrated with each other. The processor (e.g., the one or more processors or a subset thereof) may be integrated with one or more other functions (e.g., other functions such as memory). The processor may perform signal coding, data processing, power control, input/output processing, modulation, demodulation, and/or any other functionality that may enable the device to operate in a wireless environment, such as the WLAN of FIG. 1C. The processor may be configured to execute processor executable code (e.g., instructions) including, for example, software, and/or firmware instructions. For example, the processer may be configured to execute computer readable instructions included on one or more of the processor (e.g., a chipset that includes memory and a processor) or memory. Execution of the instructions may cause the device to perform one or more of the functions described herein.

A device may include one or more antennas. The device may employ multiple input multiple output (MIMO) techniques. The one or more antennas may receive a radio signal. The processor may receive the radio signal, e.g., via the one or more antennas. The one or more antennas may transmit a radio signal (e.g., based on a signal sent from the processor).

The device may have a memory that may include one or more devices for storing programming and/or data, such as processor executable code or instructions (e.g., software, firmware, etc.), electronic data, databases, or other digital information. The memory may include one or more memory units. One or more memory units may be integrated with one or more other functions (e.g., other functions included in the device, such as the processor). The memory may include a read-only memory (ROM) (e.g., erasable programmable read only memory (EPROM), electrically erasable programmable read only memory (EEPROM), etc.), random access memory (RAM), magnetic disk storage media, optical storage media, flash memory devices, and/or other non-transitory computer-readable media for storing information. The memory may be coupled to the processer. The processer may communicate with one or more entities of memory, e.g., via a system bus, directly, etc.

A WLAN in Infrastructure Basic Service Set (BSS) mode may have an Access Point (AP) for the BSS and one or more stations (STAs) associated with the AP. The AP may have access to, and/or may interface with, a Distribution System (DS) and/or another type of wired and/or wireless network that may carry traffic in and out of a BSS. Traffic to STAs that originates from outside the BSS may arrive through the AP and may be delivered to one or more STAs. Traffic originating from one or more STAs and addressed to destinations outside the BSS may be sent to an AP to be delivered to one or more respective destinations. Traffic between STAs that communicate using a same WLAN in BSS mode may also be sent through an AP where a source STA may send traffic to the AP and the AP may deliver the traffic to a destination STA. Such traffic between STAs within a same WLAN in BSS mode may be considered peer-to-peer traffic. Such peer-to-peer traffic may also be sent directly between a source STA and a destination STA using a direct link setup (DLS), such as an 802.11e DLS or an 802.11z tunneled DLS (TDLS). A WLAN in Independent BSS (IBSS) mode may have no AP. STAs using a same WLAN in IBSS mode may communicate directly with each other. This mode of communication may be referred to as an "ad-hoc" mode of communication.

In an 802.11 infrastructure mode of operation, an AP may transmit a beacon on a fixed channel that may be referred to as a primary channel. A primary channel may be 20 MHz wide and may be an operating channel of a BSS. A primary channel may be used by STAs to establish a connection with an AP. A channel access mechanism in an 802.11 system may be a mechanism that may be referred to as Carrier Sense Multiple Access with Collision Avoidance (CSMA/CA). In such a mode of operation, every STA, and any AP if present, may sense a primary channel. If a detected primary channel is determined to be busy, a detecting STA may back off or otherwise cease, at least temporarily, attempts to communicate using a detected primary channel. In such examples, it may be that only one STA may transmit at any given time in a given WLAN in BSS mode.

In examples that implement some or all of the 802.11n specification and/or the 802.11ac specification, devices implemented in such examples may operate in frequencies from 2 to 6 GHz. In other examples that implement some or all of the 802.11af and/or 802.11ah specification, devices implemented in such examples may operate in frequencies that are less than 1 GHz.

In 802.11n, High Throughput (HT) STAs may use a 40 MHz wide channel for communication. In some such examples, this may be achieved by combining a primary 20 MHz channel with an adjacent 20 MHz channel to form a 40 MHz wide channel.

In 802.11ac, Very High Throughput (VHT) STAs may support 20 MHz, 40 MHz, 80 MHz, and/or 160 MHz wide channels. 40 MHz and 80 MHz channels may be formed by combining contiguous 20 MHz channels. A 160 MHz channel may be formed by combining eight contiguous 20 MHz channels or two non-contiguous 80 MHz channels. Examples utilizing two 80 MHz channels may be referred to herein as an "80+80" configuration.

In an exemplary 80+80 configuration, transmitted data, after channel encoding, may be passed through a segment parser that may divide such data into two data streams. Inverse Fast Fourier Transform (IFFT) and time domain processing may be performed on each stream separately. The processed streams may be mapped on to two 80 MHz channels and transmitted. On an entity receiving such streams, this process may be reversed and the combined data may be provided to the receiving entity's Media Access Control (MAC) layer.

A Request to Send/Clear to Send (RTS/CTS) Short Inter-Frame Space (SIFS) may be 16 µs and a guard interval (GI) may be 0.8 µs. Transmissions from one or more nodes within 100 meters should remain within the GI, but beyond 100 meters, the delay may be longer than 0.8 µs. At 1 kilometer, the delay may be over 6 µs.

In 802.11af and/or 802.11ah, channel operating bandwidths may be reduced as compared to 802.11n and 802.11ac channel operating bandwidths. 802.11af may support 5 MHz, 10 MHz, and/or 20 MHz wide bands in TV White Space (TVWS). 802.11ah may support 1 MHz, 2 MHz, 4 MHz, 8 MHz, and/or 16 MHz wide bands in non-TVWS. STAs in 802.11ah may be sensors with limited capabilities and may be limited to supporting 1 and/or 2 MHz transmission modes.

In WLAN systems that utilize multiple channel widths, such as systems implementing some or all of the 802.11n, 802.11ac, 802.11af, and/or 802.11ah specifications, there may be a primary channel that may have a bandwidth equal to a largest common operating bandwidth supported by all STAs supported by the associated BSS. The bandwidth of the primary channel may be limited by the STA that supports the smallest bandwidth operating mode. In 802.11ah, the primary channel may be 1 or 2 MHz wide if there are STAs that only support 1 and 2 MHz modes, even though an AP and/or other STAs in the BSS may support 4 MHz, 8 MHz, and/or 16 MHz operating modes. Carrier sensing and/or navigation (NAV) setting(s) may depend on the status of the primary channel. For example, if a primary channel is busy (e.g., due to an STA supporting 1 and/or 2 MHz operating modes that is currently transmitting to the AP), then the available frequency bands may be considered busy even though a majority of the available frequency bands may remain idle and available. In 802.11ah and/or 802.11af, packets may be transmitted using a clock that may be down-clocked (e.g., four or ten times as compared to the 802.11ac specification) to assist with this issue.

In the United States, available frequency bands that may be used by 802.11ah may include frequency bands from 902 MHz to 928 MHz. In Korea, available frequency bands that may be used by 802.11ah may include frequency bands from 917.5 MHz to 923.5 MHz. In Japan, available frequency bands that may be used by 802.11ah may include frequency bands from 916.5 MHz to 927.5 MHz. The total bandwidth available for 802.11ah may be 6 MHz to 26 MHz, depending on the country in which 802.11ah is implemented.

802.11ac may utilize downlink Multi-User-Multiple-Input Multiple-Output (MU-MIMO) transmission to multiple STA's in a same symbol's time frame, such as during a downlink Orthogonal Frequency-Division Multiplexing (OFDM) symbol. Downlink MU-MIMO may also be used in 802.11ah. Each of the STA's involved in MU-MIMO transmission with an AP may be required to use the same channel or band, which may limit the operating bandwidth to the smallest channel bandwidth that may be supported by the STA's that may be included in the MU-MIMO transmission with the AP.

802.11ac may form channels by combining up to eight contiguous 20 MHz channels or two non-contiguous 80 MHz channels. Transmission procedures in 802.11ac examples may use the entire allocated bandwidth for transmission and reception. The IEEE 802.11ax specification, when finalized, may provide means for enhancing the performance of 802.11ac examples. IEEE 802.11ax may address spectral efficiency, area throughput, and/or robustness to collisions and/or interference. Orthogonal Frequency-Division Multiplexing (OFDM) may be used in Long Term Evolution (LTE) examples and/or Worldwide Interoperability for Microwave Access (WiMAX) examples to address inefficiencies that may be introduced by channel-based resource scheduling, for example as used by 802.11ac examples.

A direct application of OFDM in the form of Orthogonal Frequency-Division Multiple Access (OFDMA) to wireless local area networks, such as WiFi, may introduce backward compatibility issues. Coordinated Orthogonal Block-based Resource Allocation (COBRA) may use OFDMA methods to resolve WiFi backward compatibility issues and the implicit inefficiencies that may be caused by channel-based resource scheduling. For example, COBRA may allow for transmissions over multiple, smaller frequency-time resource units. Multiple users may be allocated to non-overlapping frequency-time resource unit(s) and may be enabled to transmit and receive simultaneously. A sub-channel may be defined as a basic frequency resource unit that an AP may allocate to an STA. For example, where backward compatibility with 802.11n/ac is desired, a sub-channel may be defined as a 20 MHz channel.

COBRA may incorporate different methods to separate multiple users, such as time domain multiplexing, frequency domain multiplexing, spatial domain multiplexing, and/or polarization domain multiplexing. For example, COBRA may employ a scheme using one or more of OFDMA sub-channelization, SC-FDMA sub-channelization, and Filter-Bank Multicarrier sub-channelization.

To assist in COBRA transmissions, methods for coverage range extension, grouping users, channel access, designing preambles for low overhead, beamforming and/or sounding, frequency and/or timing synchronization, and/or link adaptation may be used.

Timing and/or frequency synchronization algorithms may be used in embodiments, including COBRA embodiments. Multi-user and/or single user multiple parallel channel access (MU-PCA and SU-PCA, respectively) schemes may also, or instead, be used in embodiments, including COBRA embodiments.

MU-PCA and SU-PCA embodiments may utilize parallel transmit and receive channel access with symmetrical bandwidth, where down-link parallel channel access (DL PCA) may be provided for multiple and/or single users, up-link parallel channel access (UL PCA) may be provided for multiple and/or single users, or combined DL PCA and UL PCA may be provided for multiple and/or single users. In PCA embodiments (UL and/or DL), a frequency domain channel may be divided to smaller sub-channels. Each such sub-channel may have a same size or may differ in size from other sub-channels. In such embodiments, a STA may be allocated to one or more of such sub-channels. An exemplary system design may support unequal modulation and coding schemes (MCS) and/or unequal transmit power for SU-PCA and/or COBRA embodiments. In addition, or instead, physical layer (PHY) designs and procedures may be incorporated to support multi-user and/or single-user parallel channel access using transmit and/or receive with symmetrical bandwidth, while mixed MAC/PHY MU-PCA may also, or instead, be supported.

Multi-user and/or single-user parallel channel access transmit and/or receive with asymmetrical bandwidth schemes may also be used, where MAC designs and/or procedures may be used for downlink, uplink, and/or combined uplink and downlink. PHY designs and/or procedures that may support multi-user and/or single-user parallel channel access using transmit and/or receive with asymmetrical bandwidth may also, or instead, be used.

Some of the 802.11 standard descriptions may describe systems that facilitate transmission to and/or reception from a single STA in one time slot. Many transmission and/or reception designs known to those skilled in the art have been directed to single user transmission scenarios. Methods may be implemented that utilize COBRA resource allocation schemes for multiple simultaneous users. Transceiver methods may also, or instead, be implemented that utilize COBRA resource allocation schemes for multiple simultaneous users.

Some of the 802.11 standard descriptions may also describe modulation schemes for single user transmission scenario. With the introduction of a Multi-User (MU) feature, transmission design and/or modulation schemes for multi-user scenarios may be used that may improve the transmission efficiency, aggregate capacity, and/or spectrum efficiency.

A method may be used to improve the efficiency of multi-user communications that implements multi-user interleaving and/or modulation techniques. Methods and procedures for the interleaving of multi-user bits may be used. For example, a multi-user interleaver may be used. A procedure for support of feedback information may also, or instead, be used to facilitate scheduling of multi-users' bits (e.g., selects and/or groups) into a multi-user interleaver and/or modulator.

Multi-user interleaving may be implemented. Implementing support for downlink MU-MIMO for one or more 802.11 standards may include changes to the MAC layer. Modifications to the transceiver design and/or associated procedures may be used to support OFDMA-based multiple access schemes.

Support for sub-channelization may include changes to a sub-channel frequency bandwidth and/or locations of sub-carriers. A sub-channel may be defined as an allocation of a contiguous number of sub-carriers for a particular data allocation. An AP, or another non-STA, that supports OFDMA transmissions may assign one or more sub-channels to a STA.

Virtual interleaving may be implemented as described herein. $N_d$ data sub-carriers may be used in one OFDM symbol. Each of the U sub-channel users may be evenly allocated $N_u = N_d/U$ non-overlapping data sub-carriers.

Figure 2:
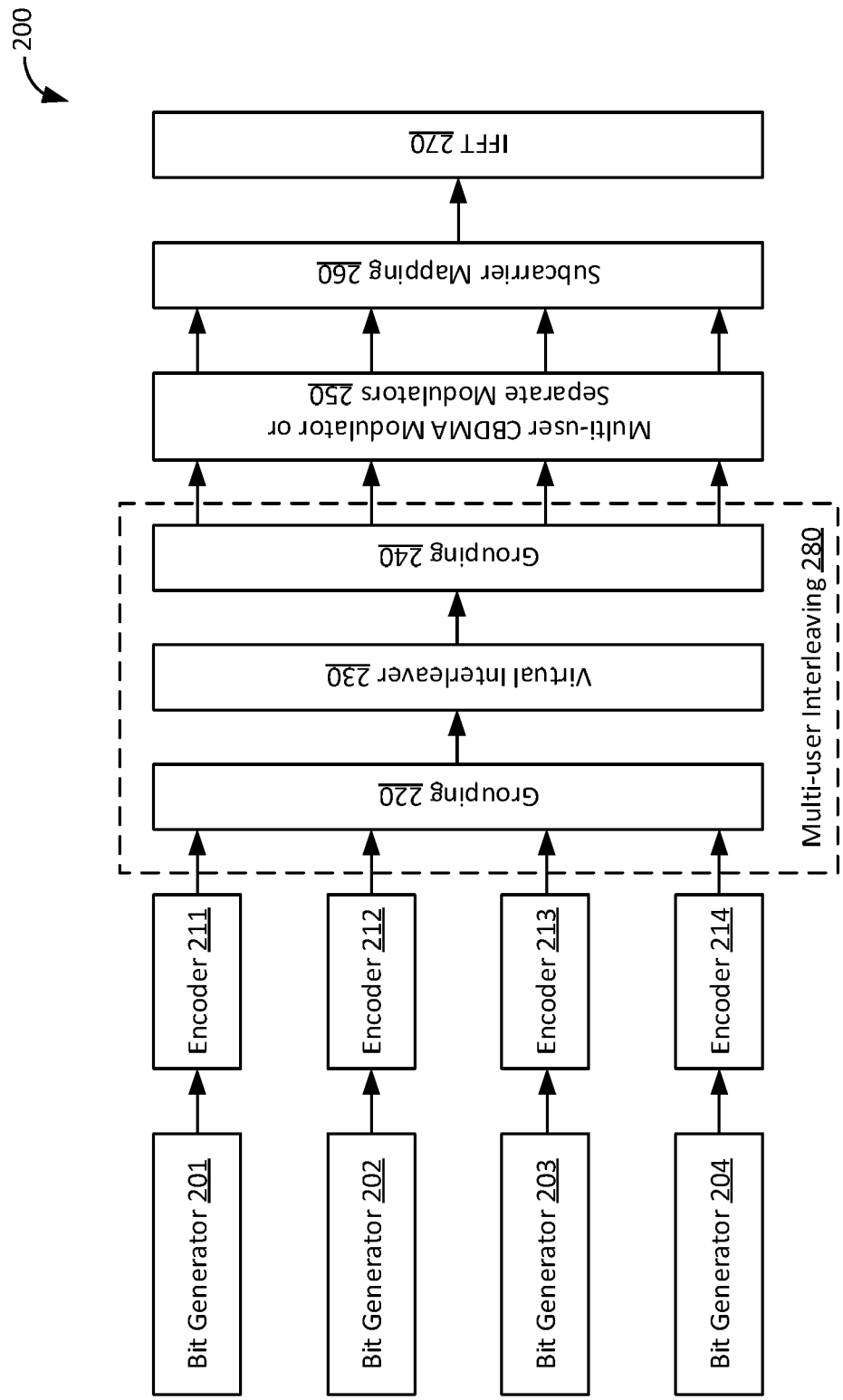
FIG. 2 is a block diagram of a non-limiting, exemplary transceiver.

An interleaver designed for, e.g., a traditional single user 20 MHz signal may be reused, e.g., to address multi-user scenarios. A diagram of exemplary transceiver 200 using virtual interleaver 230 is illustrated in FIG. 2. In transceiver 200, streams of bits associated with sub-channel users may be generated by bit generators 201, 202, 203, and 204, and encoded by encoders 211, 212, 213, and 214, respectively. These encoded bits may be processed by multi-user interleaving module 280. Multi-user interleaving module 280 may multiplex such encoded bits at grouping module 220. Grouping module 220 may generate one stream of multiplexed bits as an input to virtual interleaver 230. Virtual interleaver 230 may have a size (e.g., a number of incoming/outgoing bits per block) of $N_{int} = N_d N_{BPSCS}$.

Two permutations may be performed in virtual interleaver 230. Implemented together with sub-carrier allocation, a first permutation that may be performed by virtual interleaver 230 may ensure adjacent coded bits are mapped onto non-adjacent sub-carriers. A second permutation that may be performed by virtual interleaver 230 may ensure that adjacent coded bits are mapped onto more and less significant bits alternately. The interleaved bits may be processed by grouping module 240 before modulation and sub-carrier mapping at multi-user CBDMA modulator or separate modulators 250 and sub-carrier mapping module 260. Sub-carrier mapping module 260 may provide interleaved and mapped bits to IFFT module 270.

Grouping module 240 may separate an interleaved bit stream received from virtual interleaver 230 into U sub-streams and modulate such substreams separately using discrete modulators. Grouping module 240 may instead provide the interleaved bit stream received from virtual interleaver 230 to a constellation bit division multiple access modulator.

A virtual interleaver for multi-user implementations with equal MCS and equal information bit length for sub-channel users may be used. $c_n = [c_n(0), c_n(1), \ldots, c_n(N_u N_{BPSCS} - 1)]^T$ may denote coded bits from the output of an n-th encoder. These coded bits may be combined in a sequence $c = [c_1^T, c_2^T, \ldots, c_U^T]^T$. A first grouping may be a function $f(\bullet)$ that may operate on input sequence c. An output sequence may be denoted by $x = [x_0, x_1, \ldots, x_{N_{CBPSS}-1}]^T$. x may be sent to an interleaver for an interleaving operation. The output bit of a first interleaver permutation, $w_i$, may be given by $$w_i = x_k \quad (1)$$

$$i = U \cdot N_{BPSCS} \cdot (k \bmod N_u) + \left\lfloor \frac{k}{N_u} \right\rfloor$$

where k=0, 1, . . . , $N_{CBPSS}$−1.

An output bit of a second interleaver permutation, $y_j$, may be a function of an output of a first interleaver permutation, $w_k$, and may be given by $$y_j = w_k \quad (2)$$

$$j = s \left\lfloor \frac{k}{s} \right\rfloor + \left( k + N_{CBPSS} - \left\lfloor \frac{N_u \cdot k}{N_{CBPSS}} \right\rfloor \right) \bmod s$$

where k=0, 1, . . . , $N_{CBPSS}$−1, and $$s = \max\left\{1, \frac{N_{BPSCS}}{2}\right\}.$$

Figure 3:
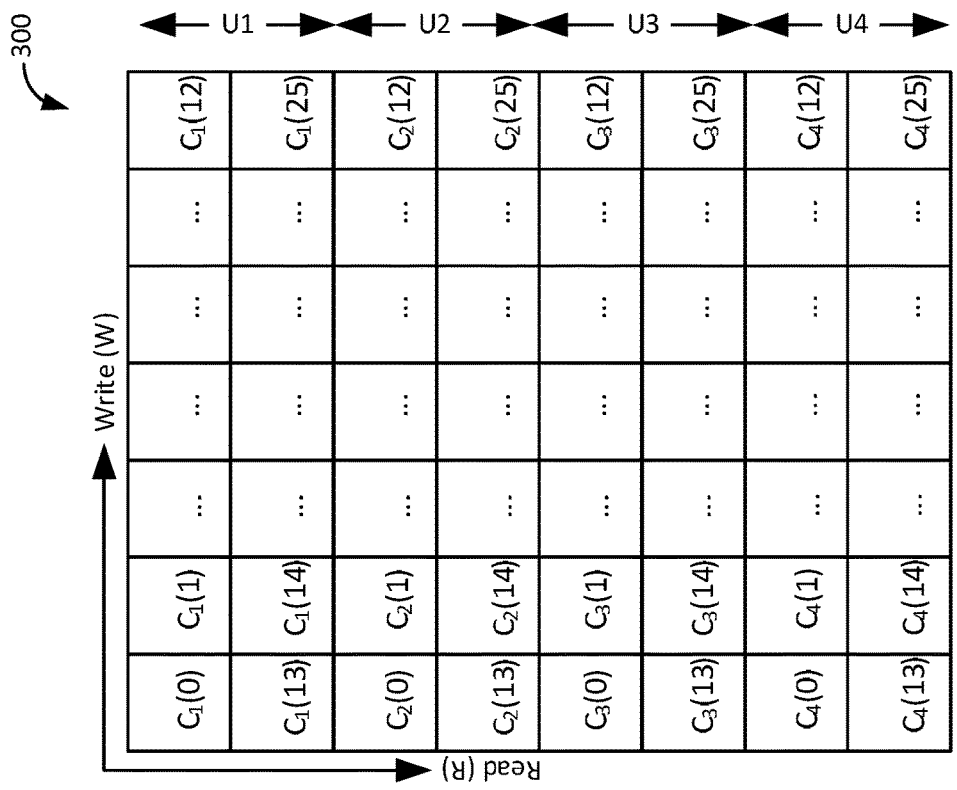
FIG. 3 is a block diagram of a non-limiting, exemplary permutation.

A virtual interleaver design may operate to generate an exemplary first permutation 300 shown in FIG. 3. In exemplary first permutation 300, a number of total data sub-carriers $N_d$=52 and four sub-channel users may be considered, such that each sub-channel user has $N_u$=13 sub-carriers. Modulation may be quadrature phase-shift keying (QPSK) and thus $N_{BPSCS}$=2. Each sub-channel user may be using a same, or equal, MCS. Bits from each sub-channel user may be indicated in FIG. 3 as $C_i$, where i=1, 2, . . . , U, representing bits from an individual sub-channel user, and each user may be indicated in FIG. 3 as Ui, where, again, i=1, 2, . . . , U. An exemplary interleaving method may sequentially write the bits from one sub-channel user and then write the bits from the next sub-channel user and so on, as indicated in FIG. 3. The output bits of the first interleaver permutation may be read out column-by-column from top to bottom, as indicated in FIG. 3.

A virtual interleaver may accommodate multiple users that utilize unequal MCSs. Unequal MCSs may have the same code rate for each sub-channel user and/or have different, or unequal, modulation orders. mu may denote the multi-user index, $m_u$=1, 2, . . . , $M_u$. A multi-user may occupy one or more sub-channels. Where unequal MCSs or different modulations for different sub-channel users are present, s and $N_{BPSCS}$ may be a function of $m_u$, and $N_{CBPSS}$ may be a function of $M_u$. A virtual interleaver accommodating unequal MCSs (e.g., MCSs having different modulations) may be described using $c_n$=[$c_n$(0), $c_n$(1), . . . , $c_n(N_u N_{BPSCS}(m_u)-1)]^T$ to denote the coded bits from the output of the n-th encoder. The coded bits may be combined into a sequence c=[$c_1^T, c_2^T, \ldots, c_U^T]^T$. A first grouping may be a function $f(\bullet)$ that may operate on input sequence c. An output sequence may be denoted by x=[$x_0, x_1, \ldots, x_{N_{CBPSS}(M_u)-1}]^T$. x may be sent to an interleaver for performance of an interleaving operation. The output bit of a first interleaver permutation, $w_k$, may be given by $$w_i = x_k \quad (3)$$

$$i = \sum_{m_u=1}^{M_u} N_{BPSCS}(m_u) \cdot (k \bmod N_u) + \left\lfloor \frac{k}{N_u} \right\rfloor$$

where k=0, 1, . . . , $N_{CBPSS}(M)$−1 and $N_{CBPSS}(M_u)$=$N_u \Sigma_{m_u=1}^{M_u} N_{BPSCS}(m_u)$.

The output bit of a second interleaver permutation, $y_j$, may be a function of an output of a first interleaver permutation, $w_k$, and may be given by $$y_j = w_k \quad (4)$$

$$j = s(m_u) \left\lfloor \frac{k}{s(m_u)} \right\rfloor + \left( k + N_{CBPSS}(M_u) - \left\lfloor \frac{N_u \cdot k}{N_{CBPSS}(M_u)} \right\rfloor \right) \bmod s(m_u)$$

where k=0, 1, . . . , $N_{CBPSS}(M_u)$−1, and $$s(m_u) = \max\left\{1, \frac{N_{BPSCS}(m_u)}{2}\right\}.$$

Figure 4:
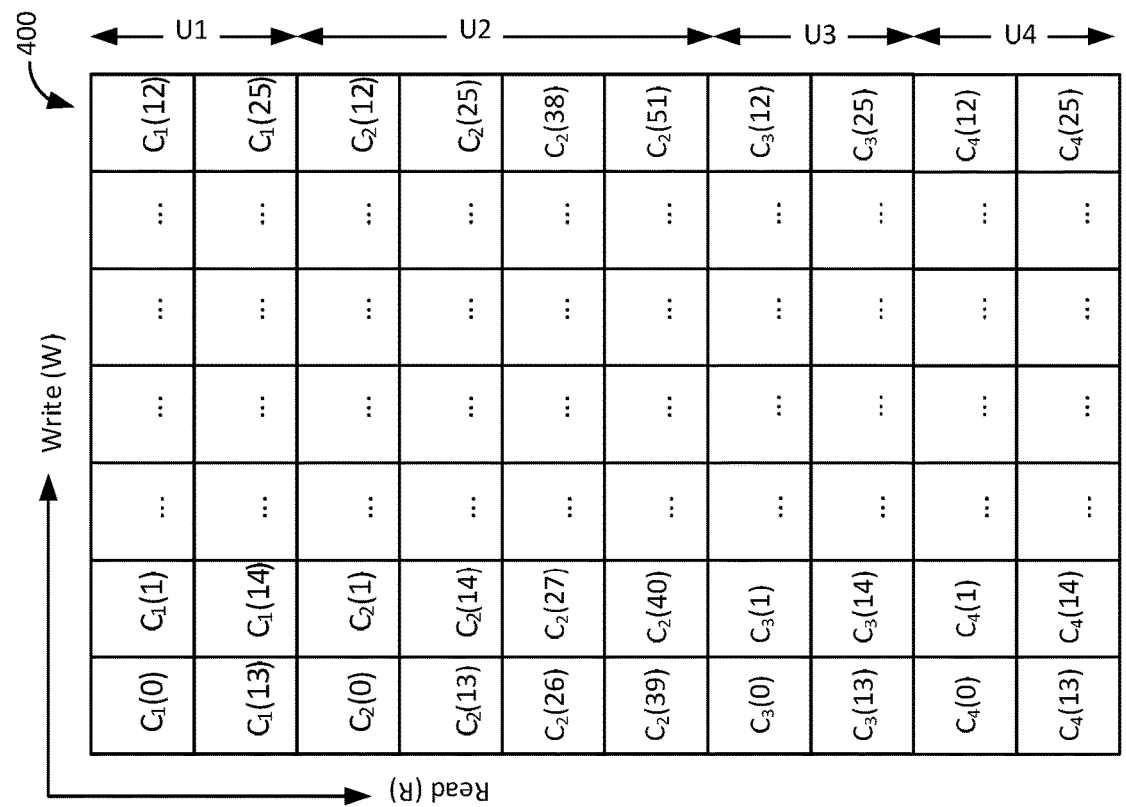
FIG. 4 is a block diagram of a non-limiting, exemplary permutation.

Exemplary permutation 400 that may be generated by a virtual interleaver for a first permutation is illustrated in FIG. 4. A number of total data sub-carriers $N_d$=52. $M_u$=U=4 sub-channel users may be considered in this example, so that each sub-channel user may have $N_u$=13 sub-carriers. In this example, the modulation for user 1, user 3, and user 4 (labeled U1, U3, and U4, respectively, in FIG. 4) may be QPSK while the modulation for user 2 (labeled U2 in FIG. 4) may be 16 quadrature amplitude modulation (16 QAM). $N_{BPSCS}(m_1)$=$N_{BPSCS}(m_3)$=$N_{BPSCS}(m_4)$=2, $N_{BPSCS}(m_2)$=4. In an exemplary interleaving method, the bits from one sub-channel user (where, in FIG. 4, bits from each sub-channel user may be indicated as $C_i$, where i=1, 2, . . . , U) may be sequentially written and the bits from the next sub-channel user may be written and so on as shown in FIG. 4. The output bits of a first interleaver permutation may be read out column-by-column from top to bottom as shown in FIG. 4.

Separate interleavers for multiple users may be used. In an OFDMA-based multiple access embodiment, a, e.g., 20 MHz channel may be considered as a baseline channel bandwidth. This baseline channel bandwidth may be partitioned into four contiguous 5 MHz sub-channels. Each sub-carrier group (SG) may be defined as a contiguous 5 MHz sub-channel (e.g., 16 sub-carriers*312.5 KHz). An AP may accommodate such sub-channel users (e.g., simultaneously) by utilizing OFDMA and may assign one SG per sub-channel user. Separate interleaver designs may use each distinct interleaver to interleave (e.g., only interleave) coded bits of a single 5 MHz sub-channel user. Each sub-channel user may have its own dedicated interleaver.

Figure 5:
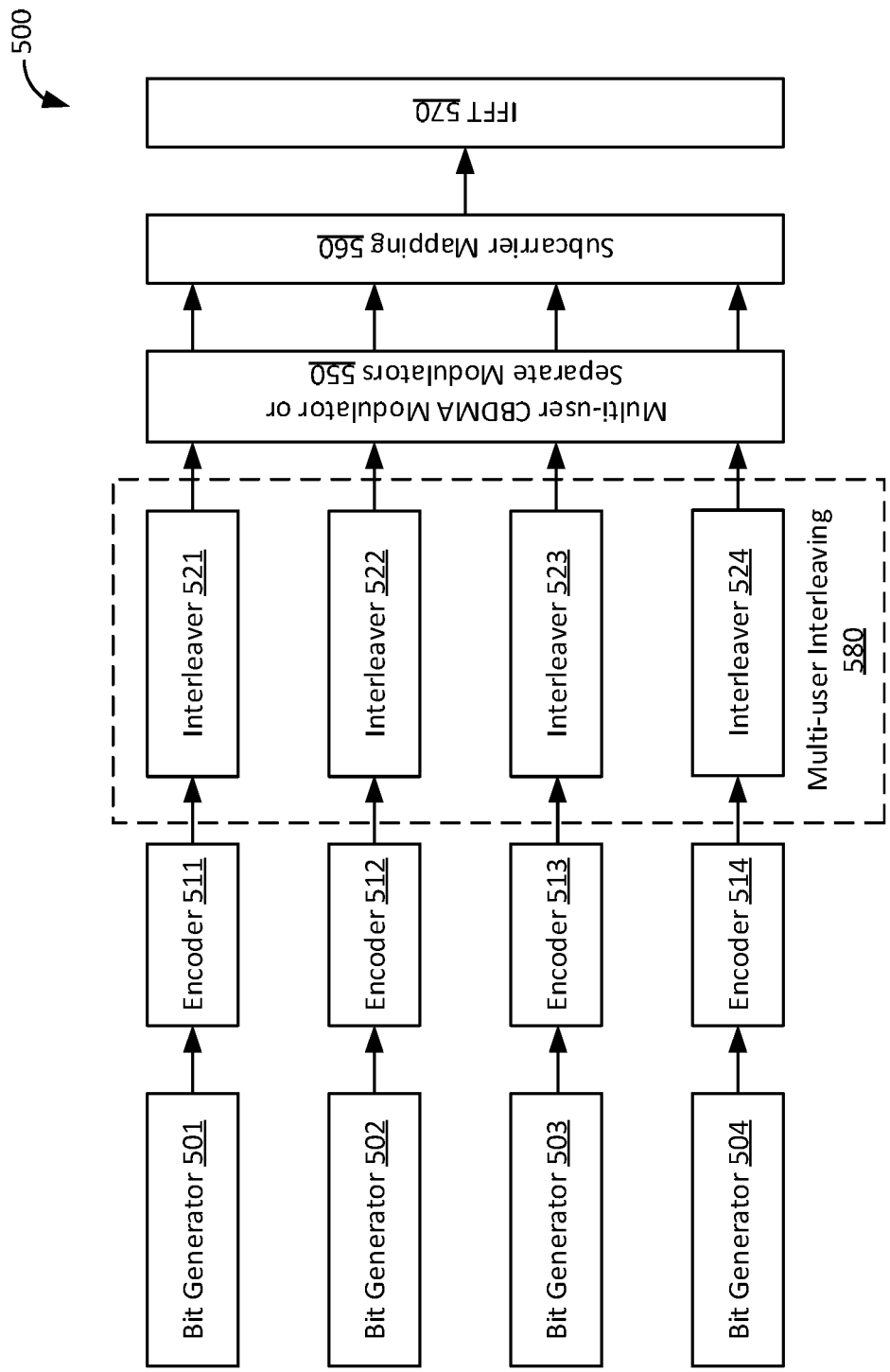
FIG. 5 is a block diagram of a non-limiting, exemplary transceiver.

Exemplary transceiver 500 is illustrated in the block diagram of FIG. 5. Transceiver 500 may use multi-user interleaving module 580, where each of interleavers 521, 522, 523, and 524 may perform interleaving for coded bits received from encoders 511, 512, 513, and 514, respectively. Encoders 511, 512, 513, and 514 may encode streams of bits received from bit generators 501, 502, 503, and 504, respectively. In transceiver 500, the streams of bits generated by bit generators 501, 502, 503, and 504 may each be associated with a single sub-channel user.

Interleavers 521, 522, 523, and 524 may provide interleaved bits for each sub-channel user to multi-user CBDMA modulator or separate modulators 550, which may provide corresponding modulated bits to sub-carrier mapping module 560. Sub-carrier mapping module 560 may provide interleaved and mapped bits to IFFT module 570.

At least one criterion may be considered in a determination of whether to use separate interleavers for each of multiple sub-channel users. A first interleaver permutation may be used to ensure that adjacent coded bits may be mapped onto non-adjacent sub-carriers, for example, because one sub-channel user may be allocated (e.g., only allocated) a portion of the total sub-carriers in one OFDMA symbol for the transmission of its data. Sub-carrier allocation may also be considered in such an embodiment. A second interleaver permutation may be used to ensure that adjacent coded bits are mapped alternatively onto less and more significant bits of the constellation. Sub-carrier allocation may also be considered in such an embodiment.

Utilizing separate interleavers, one or more same MCSs and/or one or more same encoders may be used for associated sub-channel users. For example, the same MCSs and encoders may be used for four sub-channel users. In such an embodiment, the four separate interleavers used for each of the four sub-channel users may be identical.

A criteria of ensuring that adjacent coded bits may be mapped onto non-adjacent sub-carriers may be satisfied by using a block permutation on the input bit sequence, which may operate in a column-wise input and row-wise output fashion. An interleaving bit size may be determined by $$N_{int} = \frac{N_d}{U} N_{BPSCS} M,$$

where $N_d$ may be the total number of data sub-carriers in a, e.g., 20 MHz channel bandwidth, U may be the number of sub-channel users, $N_{BPSCS}$ may be the number of coded bits per sub-carrier, and M may be the number of OFDM symbols associated with an interleaving block. A criterion of ensuring that adjacent coded bits are mapped alternatively onto less and more significant bits of a constellation may be satisfied by circularly shifting the bit ordering every $$s = \max\left\{1, \frac{N_{BPSCS}}{2}\right\} \text{ bits.}$$

Figures 6, 7:
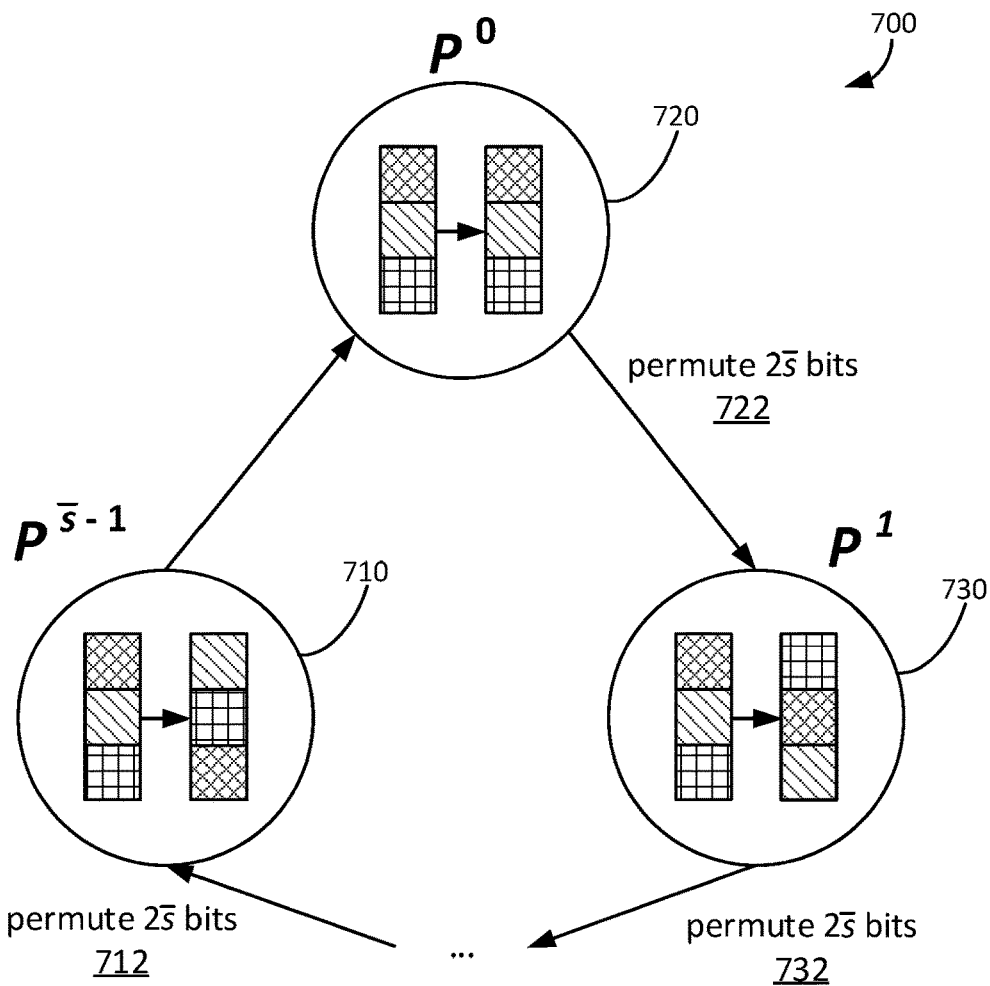
FIG. 6 is a block diagram of a non-limiting, exemplary permutation.
FIG. 7 is a block diagram illustrating a non-limiting, exemplary method.

To perform a permutation for bits on a single sub-channel in a single OFDMA symbol, an interleaver permutation that ensures that adjacent coded bits are mapped onto non-adjacent sub-carriers may be implemented using a permutation block column size is equal to a sub-carrier size. $N_d$ data sub-carriers may be used in an OFDM symbol. Each of U sub-channel users may be allocated evenly such that $N_u = N_d/U$ non-overlapping data sub-carriers. In a permutation, an interleaving bit size may be $N_{int} = N_u N_{BPSCS}$, (e.g., where a single OFDMA symbol may be used). A permutation block may have $N_u$ columns and $N_{BPSCS}$ rows. Input coded bits may be pushed into a permutation block row by row and read out by a receiving device column by column. FIG. 6 illustrates exemplary permutation 600 representing an example of bits on a single sub-channel in a single OFDMA symbol.

Bits of a single OFDMA symbol may be processed on a per sub-channel user basis and may not have constraints on a total number of OFDMA symbols per packet. An interleaving depth may be represented by $N_{BPSCS}$, for example as shown in FIG. 6. To ensure that adjacent coded bits are mapped onto non-adjacent sub-carriers, distributed sub-carrier allocation for sub-channel users may be used.

A permutation may be used for 16 QAM and above and may not affect QPSK negatively. With 16 QAM and/or higher order modulations, every $N_{BPSCS}$ bits may be mapped onto one symbol and every $\bar{s} = N_{BPSCS}/2$ symbols may be associated with either an imaginary or a real part of one symbol. There may be a set of $\bar{s}$ permutation matrices of size $\bar{s}$. Such a permutation may be performed by alternately picking one permutation matrix and applying it twice on two consecutive groups of $\bar{s}$ bits from a previous permutation output. A set of permutation matrices may be defined as integer powers of the cyclic permutation matrix P, e.g., {I, P, $P^2$, $P^{\bar{s}-1}$}, where I represents the identity matrix and P may be given by $$P = \begin{bmatrix} 0 & 0 & \cdots & 0 & 1 \\ 1 & 0 & \cdots & 0 & 0 \\ 0 & \ddots & \ddots & \vdots & \vdots \\ \vdots & \ddots & \ddots & 0 & 0 \\ 0 & \cdots & 0 & 1 & 0 \end{bmatrix}. \quad (5)$$

Exemplary method 700 for generating such a permutation for 16 QAM with $\bar{s}=3$ is illustrated in FIG. 7, where each of the blocks of 710, 720, and 130 may represent a particular bit. Any other MCS and/or value of $\bar{s}$ in any combination is contemplated. In method 700, as a non-limiting example, three permutation matrices, which may represent I, P, $P^2$ where $\bar{s}=3$, may be used. A permutation may be performed by alternately selecting one permutation matrix and applying it twice on two consecutive groups of $\bar{s}$ bits from a previous permutation output. Each of the columns of bit representations shown in 710, 710, and 730 of FIG. 7 may represent the initial set of bits for that block (on the right in the respective block) and the bits after permutation (on the left in the respective block).

For example, at block 720, an identity matrix=P may be selected and applied twice on two consecutive groups of $\bar{s}$ bits (three bits in this example). At 722, one of matrices I, P, $P^2$ may be applied twice on a next two consecutive groups of $\bar{s}$ bits from an input sequence to a permutation output of 720 to generate the matrices of 730. This process may continue, for example by selecting one of the matrices of 730 and, at 732, applying it twice on two consecutive groups of $\bar{s}$ bits from the permutation output of 730 to generate additional matrices, continuing with permutation 712 to generate matrices 710 and so forth.

One or more permutations for bits on a single sub-channel in multiple OFDMA symbols may be generated. A permutation may use an interleaving depth equal to $N_{BPSCS}$ and distributed sub-carrier allocation may be used. Coded bits associated with M OFDMA symbols may be aggregated as inputs to an interleaver. For example, each of the sub-channel users may have $N_u$ data sub-carriers. An interleaving bit size may be $N_{int} = N_u N_{BPSCS} M$. A permutation block may have $N_u$ columns and $N_{BPSCS} M$ rows. An input and output rule may be the same as, or similar to, that used in permutations for bits on a single sub-channel in single OFDMA symbol as described herein. An interleaving depth may be $N_{BPSCS} M$, which may support localized and/or distributed sub-carrier allocation.

Overhead may be introduced by fixing the number of OFDMA symbols for an interleaving permutation because a number of coded bits in a packet may not be equal to or approximate to integer multiples of the interleaving bit size. Splitting a coded bit sequence into chunks of size $N_u N_{BP}$ $_{scs}$M bits may result in a final chunk that may have very few data bits and/or a number of padded zeros.

Figure 8:
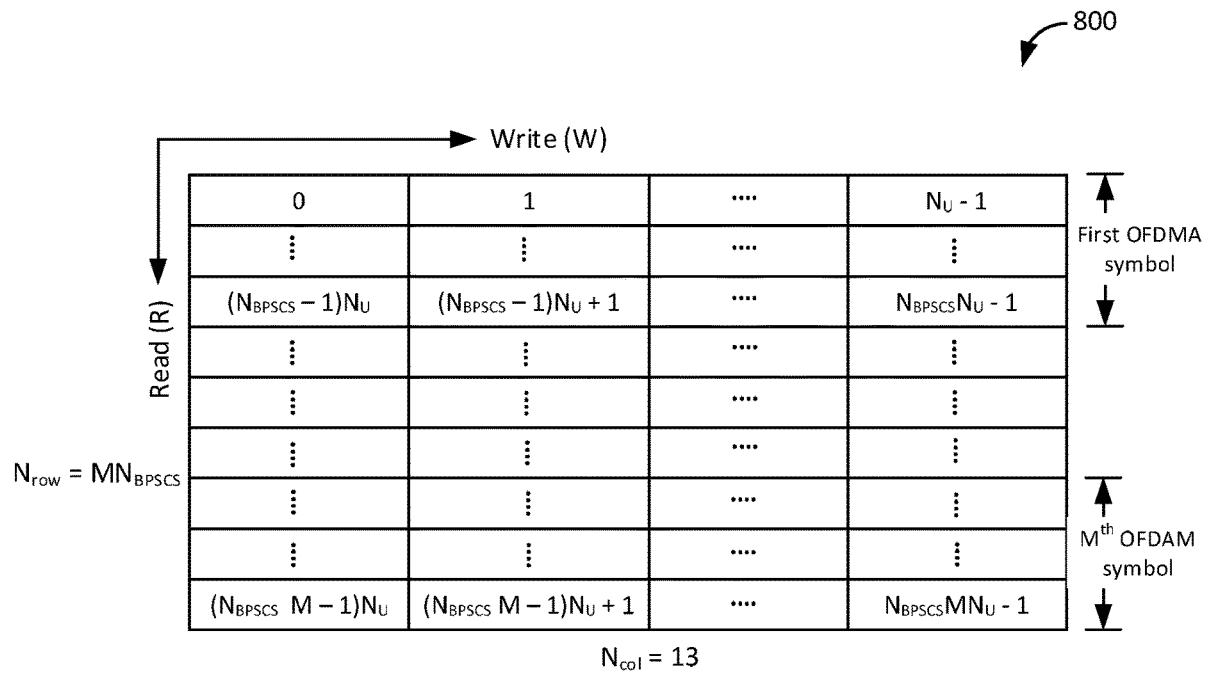
FIG. 8 is a block diagram of a non-limiting, exemplary permutation.

Exemplary permutation 800 shown in FIG. 8 is an example of a permutation for bits on a single sub-channel in multiple OFDMA symbols. Another permutation for more and less significant bits may be the same as, or similar to, that shown in FIG. 8, and may handle more and less significant bits similarly to permutations for bits on a single sub-channel in a single OFDMA symbol as described herein.

Figure 9:
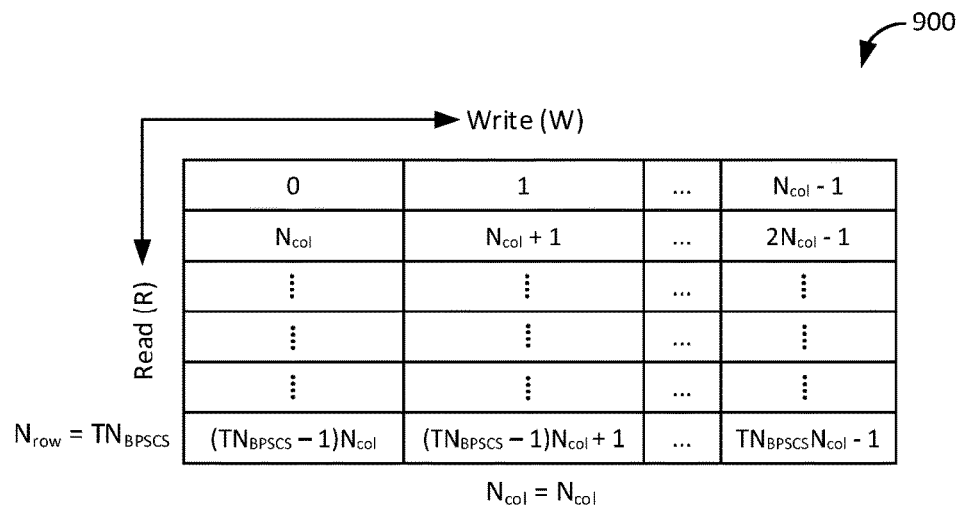
FIG. 9 is a block diagram of a non-limiting, exemplary permutation.

A permutation for bits on a single sub-channel in a single OFDMA symbol may be implemented using a permutation block column size that may be unequal to a sub-carrier size. In a permutation for bits on a single sub-channel in a single OFDMA symbol where a permutation block column size may be equal to a sub-carrier size as described above, a number of columns of a permutation block may be chosen to be $N_u$. $N_u$ may be a same number as a number of sub-carriers in one sub-channel. Given an interleaving bit size of $N_u N_{BPSCS}$, an interleaver depth may be $N_{BPSCS}$. $N_u$ may be a product of two integers, e.g., $N_u = N_{col}T$. In such an embodiment, a permutation block may have $N_{col}$ columns and $TN_{BPSCS}$ rows. An interleaver depth may be $TN_{BPSCS}$. Input bits that may be associated with a single OFDMA symbol may be used and may avoid potential additional overhead. Support for either or both localized and distributed sub-carrier allocation may be provided. The distance in sub-carrier mapping of adjacent coded bits may increase with an increasing T when a localized sub-carrier allocation may be taken into consideration. Exemplary permutation 900 illustrated in FIG. 9 is an example of such a permutation. A subsequent permutation may handle more and less significant bits similarly to examples employing a permutation for bits on a single sub-channel in a single OFDMA symbol as described herein.

Figure 10:
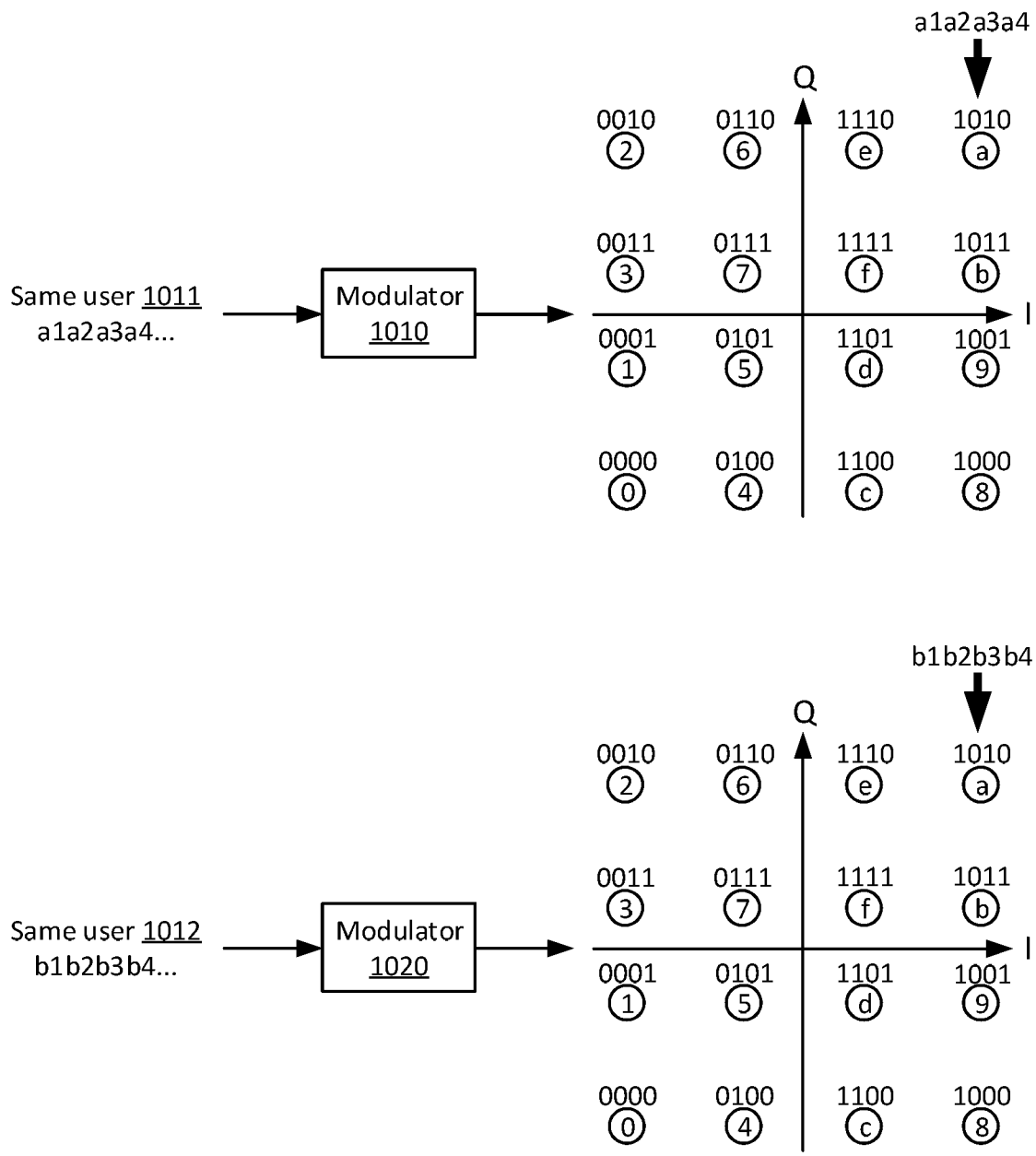
FIG. 10 is a block diagram of non-limiting, exemplary modulators.

Multi-user modulation may be used for modulation in multi-user scenarios. A separate multi-user modulator may be used for each multi-user in such a scenario. Each such user may use its own separate modulator and every constellation symbol (or modulated QAM symbol) may consist of bits from the same user. An example of a two-user modulator is illustrated in FIG. 10 where the 16 QAM constellation symbol for user 1011 as modulated by modulator 1010 consists of the bits only from user 1011 and where the 16 QAM constellation symbol for user 1012 as modulated by modulator 1020 consists of the bits only from user 1012.

Figure 11:
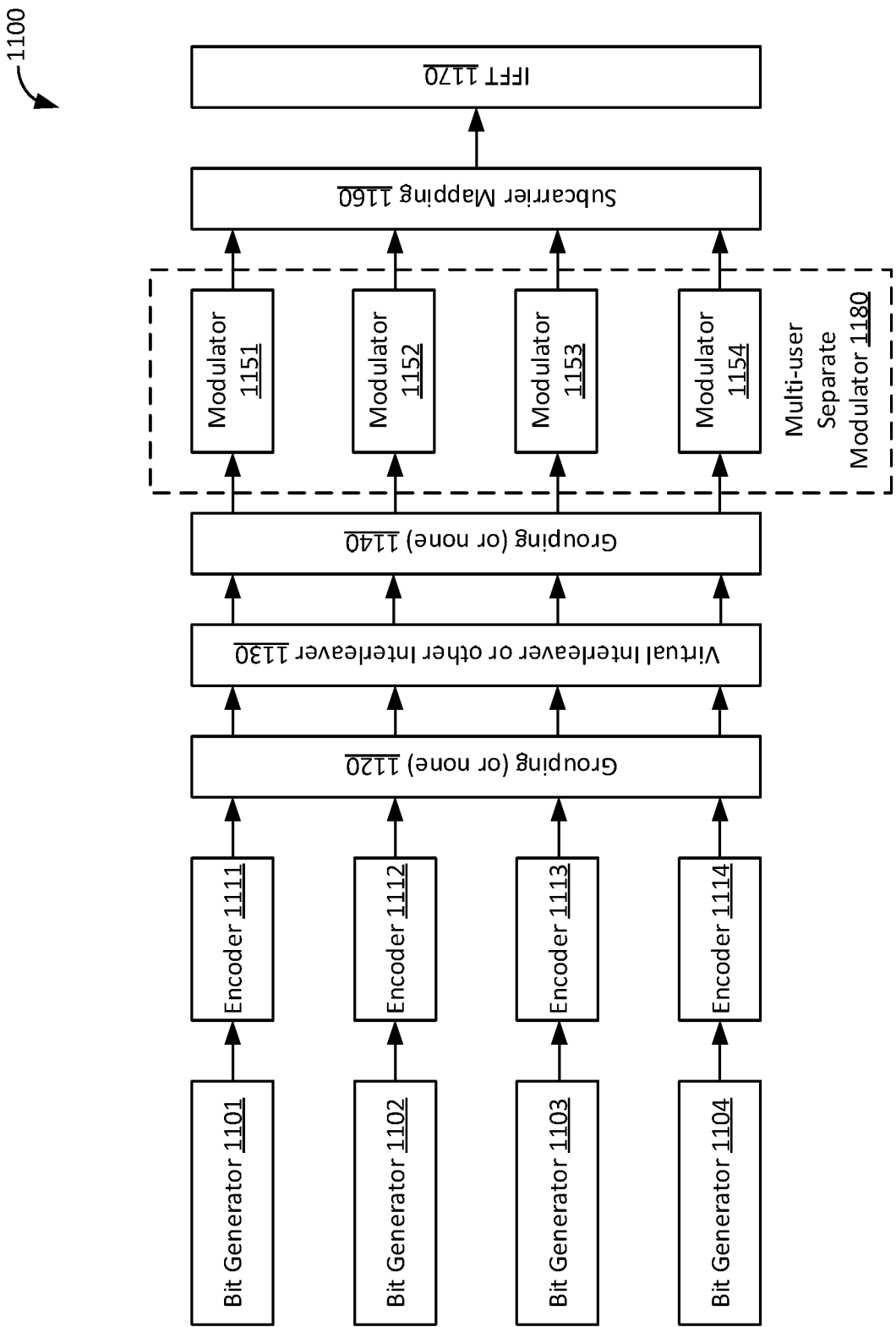
FIG. 11 is a block diagram of a non-limiting, exemplary transceiver.

A transceiver may employ separate multi-user modulators. FIG. 11 shows diagram a block diagram of exemplary, non-limiting transceiver 1100 that may use separate modulators for multi-user scenarios. Transceiver 1100 may use multi-user separate modulator module 1180, which may include modulators 1151, 1152, 1153, and 1154 that each may be dedicated to an individual user. Bits received from such users may be generated by bit generators 1101, 1102, 1103, and 1104, and encoded by encoders 1111, 1112, 1113, and 1114, respectively. These encoded bits may be grouped by grouping module 1120, but may instead not be processed by a grouping module. Grouped or otherwise encoded bits may be interleaved by virtual or other interleaver 1130, and may be grouped by grouping module 1140, or may instead not be processed by a grouping module after processing by interleaver 1130.

Interleaved bits for each sub-channel user may be provided to modulators 1151, 1152, 1153, and 1154 for individual modulation (e.g., separate modulation for each user by modulators 1151, 1152, 1153, and 1154). The resulting modulated bits for each user may be provided to sub-carrier mapping module 1160, which may provide interleaved and mapped bits to IFFT module 1170.

In an exemplary embodiment similar to that exemplified by FIG. 11, four users may be served, each by one of bit generators 1101, 1102, 1103, and 1104. The bit streams generated by bit generators 1101, 1102, 1103, and 1104 for each user, which may be processed by encoders 1111, 1112, 1113, and 1114, grouping module 1120, virtual and/or other interleaver 1130, grouping module 1140, and/or modulators 1151, 1152, 1153, and 1154, may be mapped to complex constellation points associated with a respective stream corresponding to each user by sub-carrier mapping module 1160.

Interleaver 1130 may be a distinct, separate interleaver or a virtual interleaver. Where interleaver 1130 is a separate, distinct interleaver, no grouping may be performed (e.g., grouping module 1120 and/or 1140 may not be used) and each user's interleaved bits may be fed into separate modulators 1151, 1152, 1153, and 1154. Where a virtual interleaver is used, the interleaved bits may be grouped with those of different users, for example by grouping module 1120 and/or grouping module 1140, and then fed into a separate modulator for each user's bit, such as separate modulators 1151, 1152, 1153, and 1154. Separate modulators 1151, 1152, 1153, and 1154 may each be a BPSK, QPSK, 16-QAM, 64-QAM, and/or 256-QAM modulator, or any other modulator.

In this an embodiment, a multi-user constellation bit division multiple access modulator (MU-CBDMAM) may be used that may support multi-user modulation. Based on design criteria, an exemplary MU-CBDMAM may provide MU diversity gain, increase information access probability for multiple users, improve frequency diversity, and/or provide flexible equal/unequal error protection for different users.

A modulator may modulate bits from single user.

An MU-CBDMAM may generate one or more constellation symbols (and/or one or more modulated QAM symbols) that may include bits that may be from multiple users and/or different users. At least one of such symbols may have different weighting from the other symbols as a first bit of an I or a Q branch may have more protection than a second bit of such an I or Q branch.

MU-CBDMAM modulation may be applied with uniform constellation (UC) or with non-uniform constellation (NUC) to allow a constellation symbol to be mapped using bits from multiple users. MU-CBDMAM modulation may use a multiple access (MA) scheme for multiple users that may be achieved at a constellation level by allowing each constellation symbol to include bits from different users. MU-CBDMAM modulation may be open loop or closed loop MU-CBDMAM modulation. Whether MU-CBDMAM modulation is open loop or closed loop may be based on a control signal that may be referred to as a "user selector." A value of a user selector may be based on feedback received from one or more MU receivers. MU-CBDMAM modulation may function as a modulation scheme that may be combined with single-carrier and/or multi-carrier transmission embodiments, such as, e.g., OFDM, that may provide multiple access capability for a multi-user embodiment.

Figure 12:
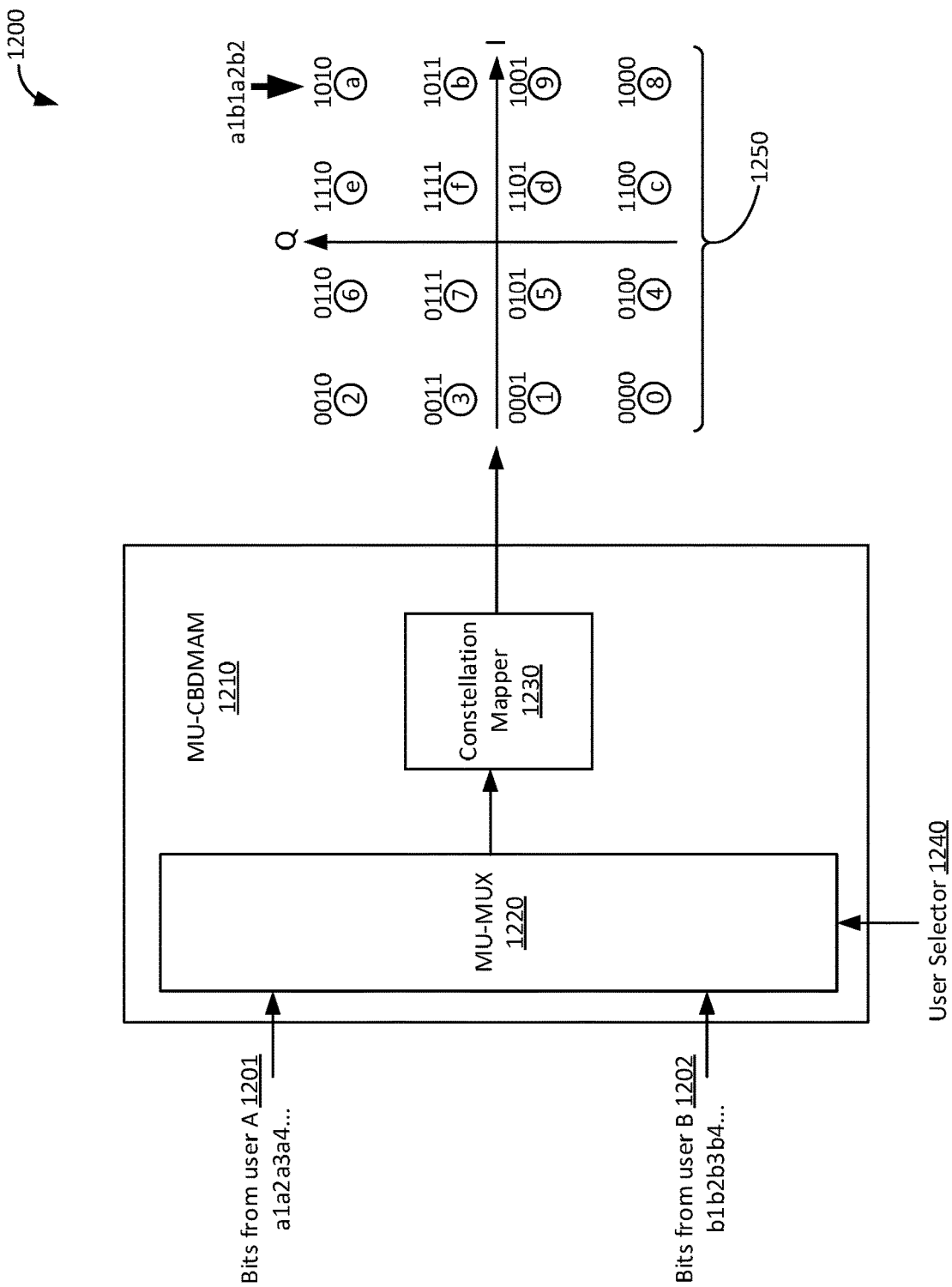
FIG. 12 is a block diagram of a non-limiting, exemplary modulator.

An MU-CBDMAM may be used in COBRA implementations as well as other implementations. One or more constellation symbols, which may be modulated constellation symbols, and/or 16 QAM symbols (in an embodiment, modulated 16 QAM symbols) may include bits that may be from multiple and/or different users. For example, exemplary two-user MU-CBDMAM 1210 is illustrated in system 1200 shown in FIG. 12. Multi-user multiplexer (MU-MUX) 1220 of MU-CBDMAM 1210 may select bits from user A 1201 and/or user B 1202 based on user selector signal 1240. This selection may be used to feed selected bits to constellation mapper 1230 mapper that may generate one more modulated symbols 1250, each of which may be 16 QAM and/or QPSK symbols. Constellation mapper 1230 may, e.g., generate Gray-coded constellation mappings. Other constellation mappings are contemplated in the present disclosure.

Each of constellation symbols 1250 (which may be 16 QAM and/or QPSK symbols) may include bits that are from more than one user (e.g., bits from user A 1201 and user B 1202). Constellation mapper 1230 may be a single joint constellation mapper for MU-CBDMAM 1210 or M separate constellation mappers, where M represents a number of users. Where constellation mapper 1230 is a joint constellation mapper, such a mapper may run N_BPSCS (e.g., a modulation order) times faster than if constellation mapper 1230 were a separate constellation mapper. In an example such as that shown in FIG. 12, $N_{BPSCS}=4$ in a 16QAM embodiment. User selector signal 1240 may be a predefined signal or a feedback signal and may be based on whether MU-CBDMAM 1210 is an open loop MU-CBDMAM or a closed loop MU-CBDMAM.

Note that in this disclosure, an MU-CBDMAM may be independent of an interleaver and may operate or otherwise be configured with any one or more interleavers disclosed herein or any other one or more interleavers, and any combination thereof. All such embodiments are contemplated as within the scope of this disclosure.

Figure 13:
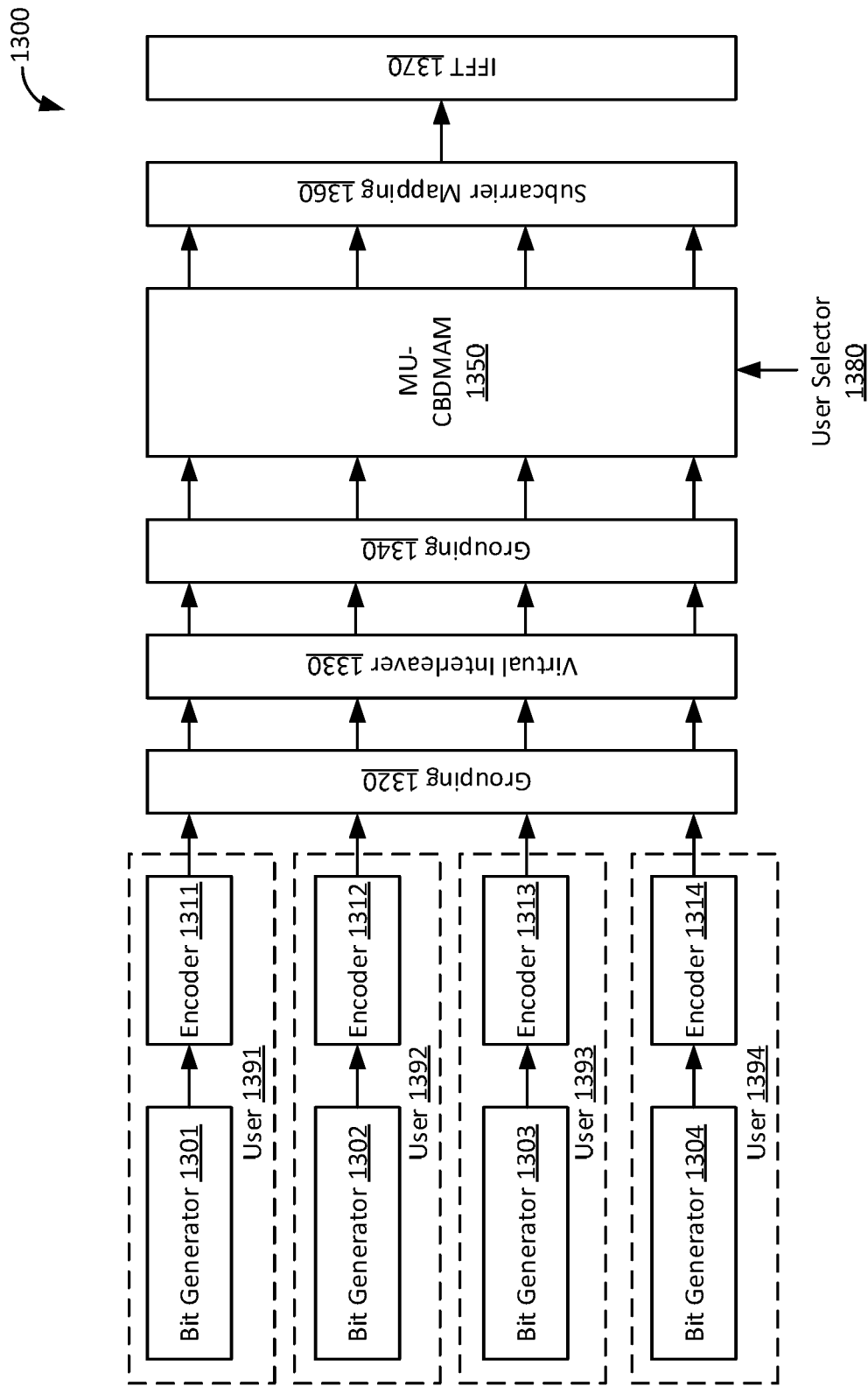
FIG. 13 is a block diagram of a non-limiting, exemplary transceiver.

Exemplary transmitter 1300 of FIG. 13 may utilize MU-CBDMAM 1350. In the illustrated exemplary embodiment, four users 1391, 1392, 1393, and 1394 may be associated with bit generators 1301, 1302, 1303, and 1304, respectively, and with encoders 1311, 1312, 1313, and 1314, respectively. Virtual interleaver 1330 may be used, as well as grouping modules 1320 and/or 1340. Note that it is also contemplated that an embodiment may use one or neither of grouping modules 1320 and 1340.

A design of MU-CBDMAM 1350 may not be based on a design of interleaver 1330, and other interleaver implementations are contemplated as within the scope of the instant disclosure. A design of MU-CBDMAM 1350 may function with OFDM and/or OFDMA as described herein, but other channel access methods are contemplated as within the scope of the instant disclosure.

Exemplary transceiver 1300 may be implemented for four users, although any number of users are contemplated as within the scope of the instant disclosure. Illustrated discrete bit generators 1301, 1302, 1303, and 1304 and encoders 1311, 1312, 1313, and 1314 may correspond to such exemplary users. The respective bit streams for each user provided at the output of interleaver 1330 (such bits may also be grouped by grouping module 1320 and/or grouping module 1340) may be mapped to complex constellation points by MU-CBDMAM 1350 and mapped to sub-carriers by sub-carrier mapping module 1360. MU-CBDMAM 1350 may select bits from each of users 1391, 1392, 1393, and 1394 based on user selector signal 1380.

Interleaver 1330 may be a single virtual interleaver and interleaved bits from users 1391, 1392, 1393, and 1394 may be grouped and/or de-grouped, e.g., by grouping module 1320 and/or grouping module 1340 and may be provided to MU-CBDMAM 1350. Design criteria used for an implementation of MU-CBDMAM 1350 may differ from criteria used in embodiments employing separate interleavers (e.g., exemplary interleavers 1431, 1432, 1433, and 1434 shown in FIG. 14). Interleaver 1330 may map each user's bits alternatively onto more important levels and less important levels.

Figure 14:
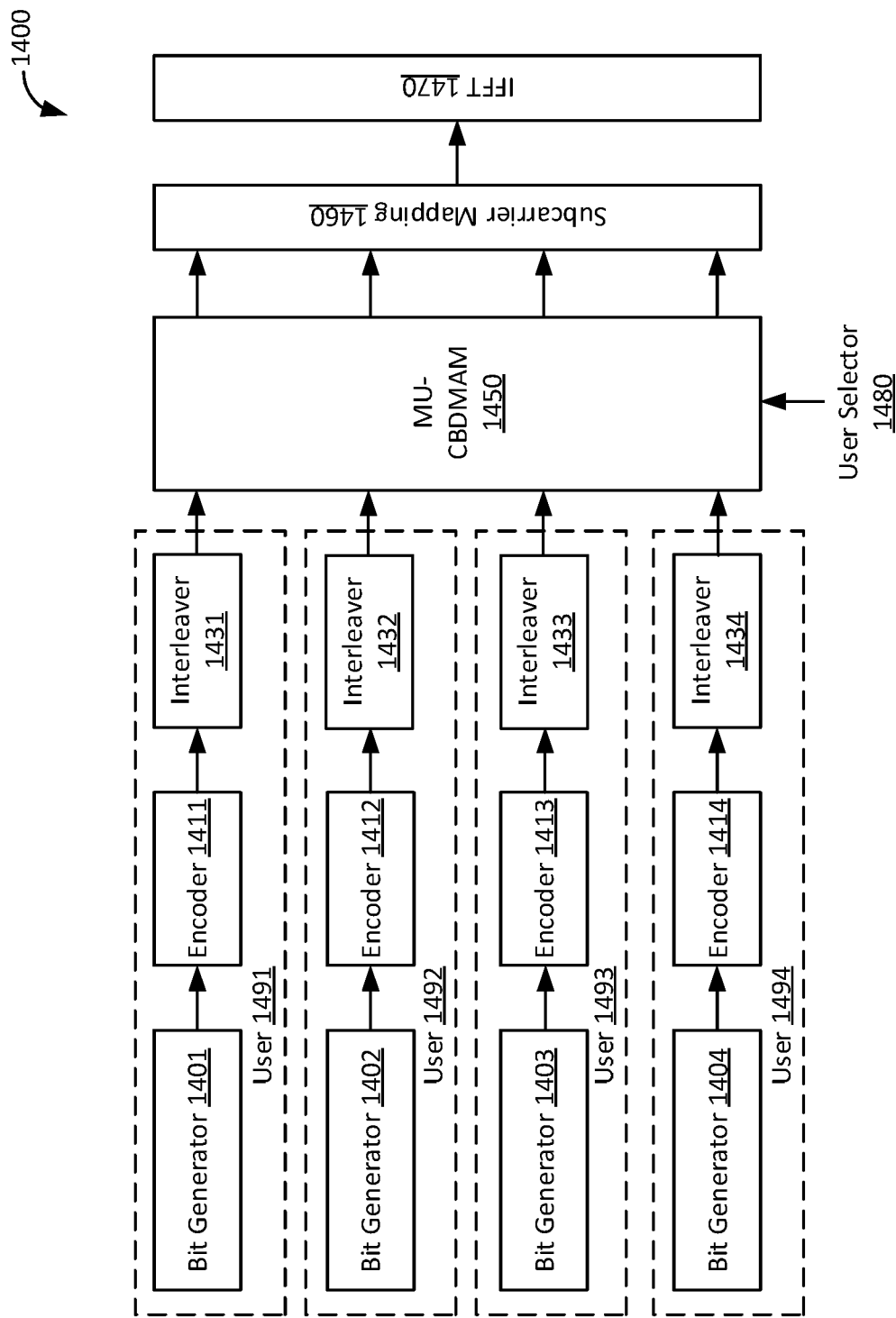
FIG. 14 is a block diagram of a non-limiting, exemplary transceiver.

Exemplary transceiver 1400 of FIG. 14 may utilize MU-CBDMAM 1450. In the illustrated exemplary embodiment, four users 1491, 1492, 1493, and 1494 may be associated with bit generators 1401, 1402, 1403, and 1404, respectively, and with encoders 1411, 1412, 1413, and 1414, respectively. Separate, discrete interleavers 1431, 1432, 1433, and 1434 may be used for each of users 1491, 1492, 1493, and 1494, respectively.

A design of MU-CBDMAM 1450 may not be based on a design of interleavers 1431, 1432, 1433, and 1434, and other interleaver implementations are contemplated as within the scope of the instant disclosure. A design of MU-CBDMAM 1450 may function with OFDM and/or OFDMA as described herein, but other channel access methods are contemplated as within the scope of the instant disclosure.

Exemplary transceiver 1400 may be implemented for four users, although any number of users are contemplated as within the scope of the instant disclosure. Illustrated discrete bit generators 1401, 1402, 1403, and 1404 and encoders 1411, 1412, 1413, and 1414 may correspond to such exemplary users. The respective bit streams for each user provided at an output of each of interleavers 1431, 1432, 1433, and 1434 may be mapped to complex constellation points by MU-CBDMAM 1450 and mapped to sub-carriers by sub-carrier mapping module 1460. MU-CBDMAM 1450 may select bits from each of users 1491, 1492, 1493, and 1494 based on user selector signal 1480. Interleaved and mapped bits may be provided to IFFT module 1470 by sub-carrier mapping module 1460.

Design criteria used for an implementation of MU-CBDMAM 1450 may differ from criteria used in embodiments employing a virtual interleaver (e.g., exemplary modulator 1350 shown in FIG. 13). Interleaver 1450 may map each user's bits alternatively onto more important levels and less important levels.

Figure 15:
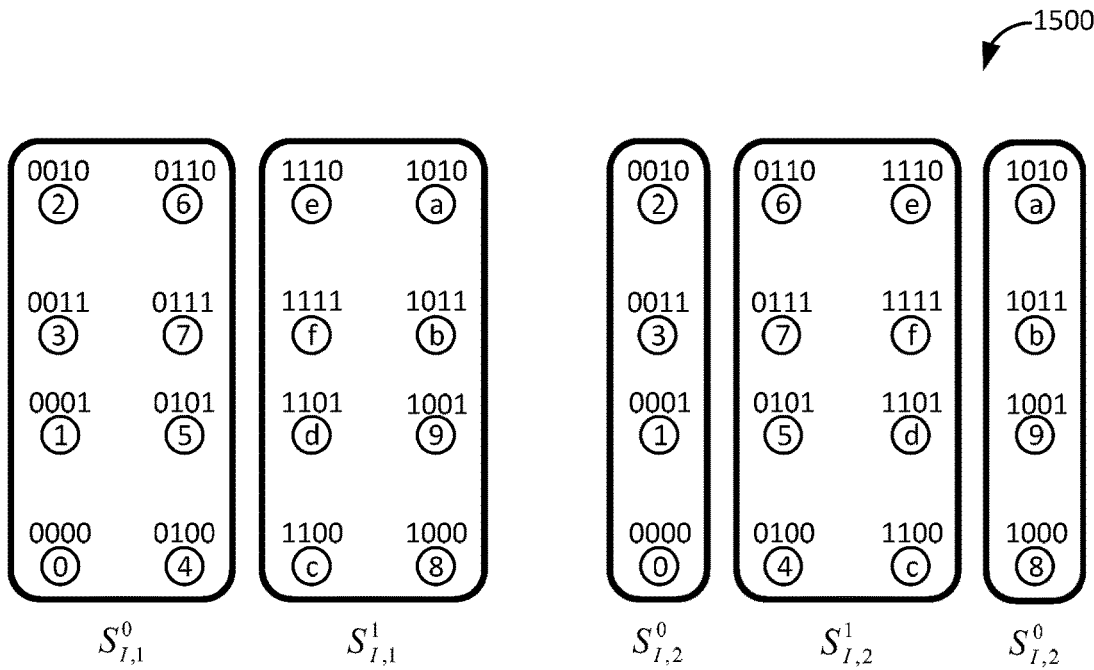
FIG. 15 is a block diagram illustrating non-limiting, exemplary symbol sets.
Figure 16:
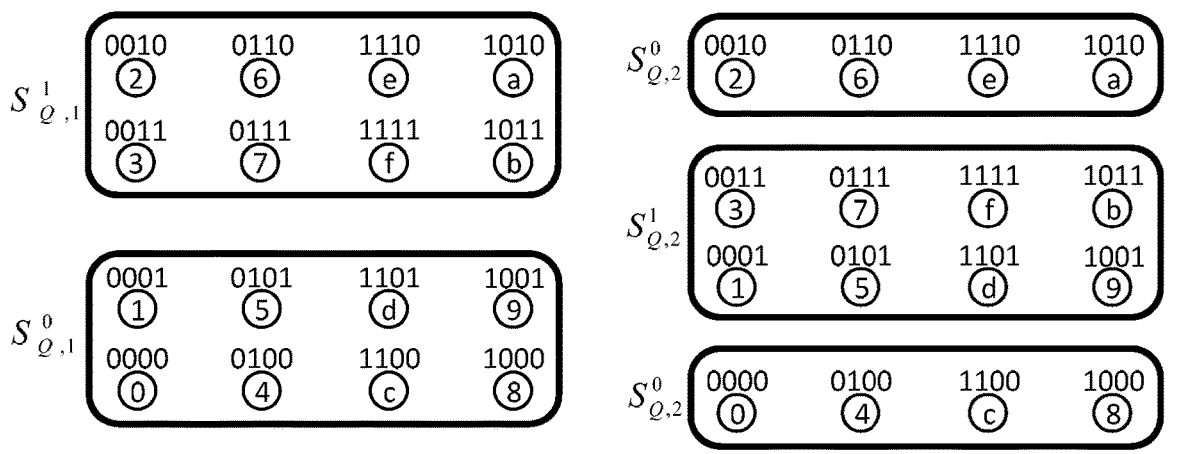
FIG. 16 is a block diagram illustrating non-limiting, exemplary symbol sets.

Various means and methods of implementing an MU-CBDMAM modulator may be used in the disclosed embodiments. MU-CBDMAM modulators may have equal or unequal error probabilities. For example, $S_{I,k}^1$ may represent a set of transmitted symbols that have a '1' in the $k^{th}$ bit of an I-branch while $S_{I,k}^0$ may represent a set of symbols that have a '0' in the $k^{th}$ bit of I-branch. In this example, $S_{Q,k}^0$ and $S_{Q,k}^1$ may apply to a Q-branch. Referring now to diagrams 1500 and 1600 of FIGS. 15 and 16, respectively, $S_{I,1}$ may have less of a probability to be an error than $S_{I,2}$. $S_{Q,1}$ may have less of a probability to be an error than $S_{Q,2}$. A first bit of a constellation symbol of either an I or a Q branch may have more error protection than a second bit of a constellation symbol of either the I or the Q branch. This aspect may be used to address multi-user simultaneous transmission in a fading environment.

In a fading environment, different users may have different channel gains for a sub-carrier and/or a sub-channel. An MU-CBDMAM may provide equal error protection for different users based on the users' respective channel gains. This may allow for additional scheduling gain that may be obtained for downlink (DL) OFDMA. This aspect of the instant disclosure may be referred to as closed loop MU-CBDMAM due to the use of channel and/or channel-related information.

MU-CBDMAM may also, or instead, allow unequal error protection for different users, e.g., for scheduling fairness and/or simplicity. This aspect of the instant disclosure may be referred to as open loop MU-CBDMAM as knowledge of channel information may not be available.

Figure 17:
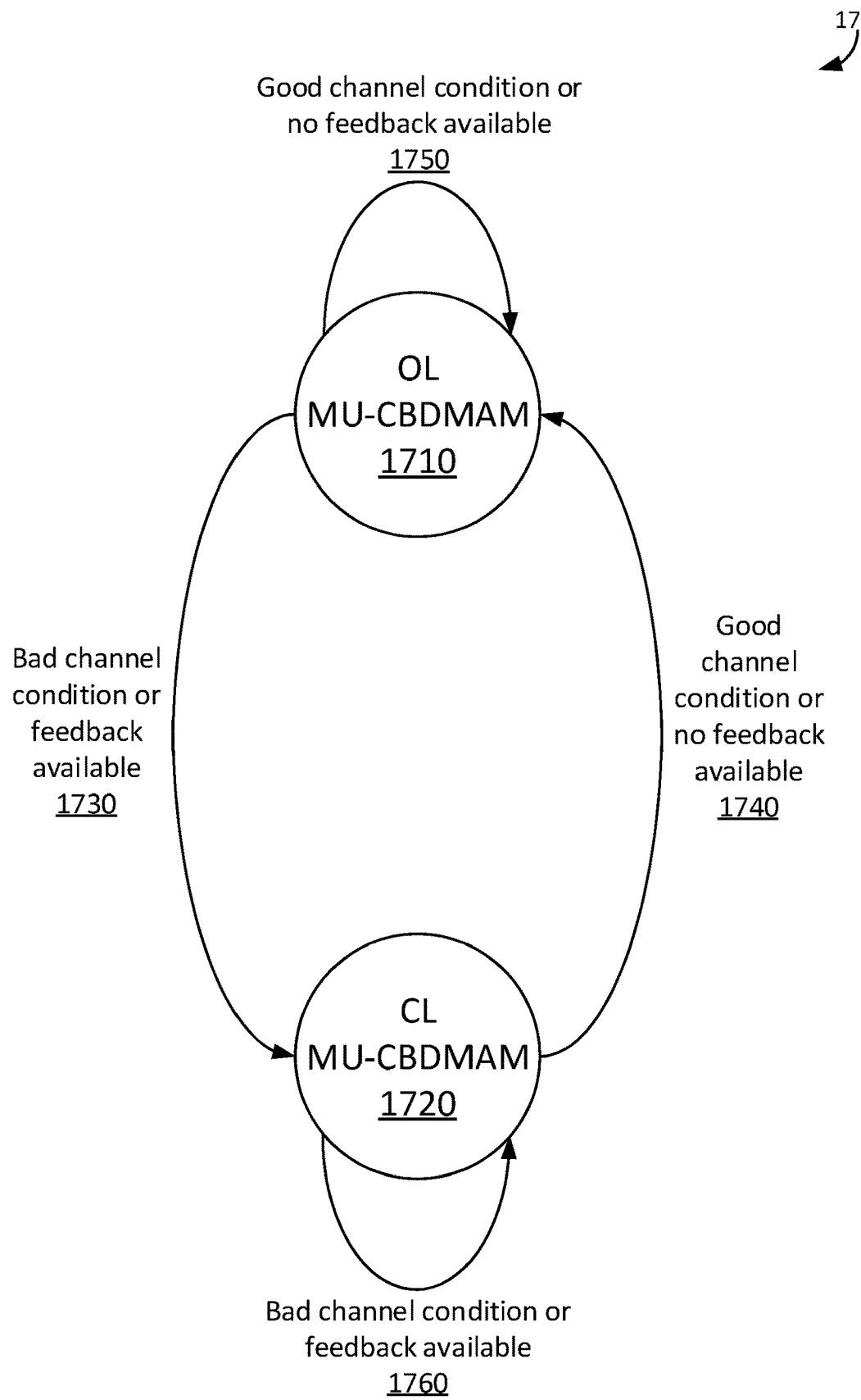
FIG. 17 is a block diagram illustrating a non-limiting, exemplary state machine.

Operating as an open loop MU-CBDMAM or a closed loop MU-CBDMAM may be dynamically switched by an MU-CBDMAM based on knowledge and/or a condition of a channel, as shown in FIG. 17 illustrating MU-CBDMAM state machine 1700 that may be implemented by an MU-CBDMAM modulator. In this example, an MU-CBDMAM may be operating in open loop MU-CBDMAM state 1710. If it is determined at 1750 that there may exist a good channel condition and/or that there may be no feedback available, the MU-CBDMAM implementing exemplary state machine 1700 and operating in open loop MU-CBD-MAM state 1710 may remain operating in open loop MU-CBDMAM state 1710.

Where a poor channel condition is detected and/or where feedback is available to the MU-CBDMAM operating in open loop MU-CBDMAM state 1710, at 1730 an MU-CBDMAM implementing exemplary state machine 1700 may begin operating in closed loop MU-CBDMAM state 1720. If, when operating in closed loop MU-CBDMAM state 1720, an MU-CBDMAM detects a poor channel condition and/or where feedback is available at 1760, such an MU-CBDMAM may remain operating in closed loop MU-CBDMAM state 1720.

If, when operating in closed loop MU-CBDMAM state 1720, an MU-CBDMAM detects a good channel condition and/or no feedback is available at 1740, an MU-CBDMAM implementing exemplary state machine 1700 and operating in closed loop MU-CBDMAM state 1720 may begin operating in open loop MU-CBDMAM state 1710.

An open loop (OL) MU-CBDMAM may be used in implementations where unequal error protection among users' transmissions may be desired (e.g., for scheduling fairness and/or simplicity). The controlling user selector signal may be one or any combination of a predefined user selection patterns (e.g., where each user of multi-users may be alternatively selected to construct each constellation symbol), one or more constellation symbols constructed by a randomly selected user, and/or an access category (AC) or a quality of service (QoS) associated with different users.

A closed loop (CL) MU-CBDMAM may be used in implementations where equal error protection among users' transmissions may be desired (e.g., for multi-user diversity and/or scheduling gain). Because different users may have different channel gains for a respective sub-carrier or sub-channel, once an AP knows channel and/or channel-related information for each of the different users, the AP may assign different weighting, different bits, and/or different significance levels of constellation symbol(s) to different users. A user with more fading for its channel(s) may obtain more error protection while a user with relatively less channel fading for its channel(s) may obtain less error protection when, for example, the AP maps the user with more channel fading onto a more significant level while mapping the user with less channel fading to less significant level.

The controlling user selector signal may be based on any one or any combination of channel state information (CSI), channel quality indicator (CQI), a signal to noise ratio (SNR), an acknowledgement (ACK), a negative acknowledgement (NACK), or any other data.

Figure 18:
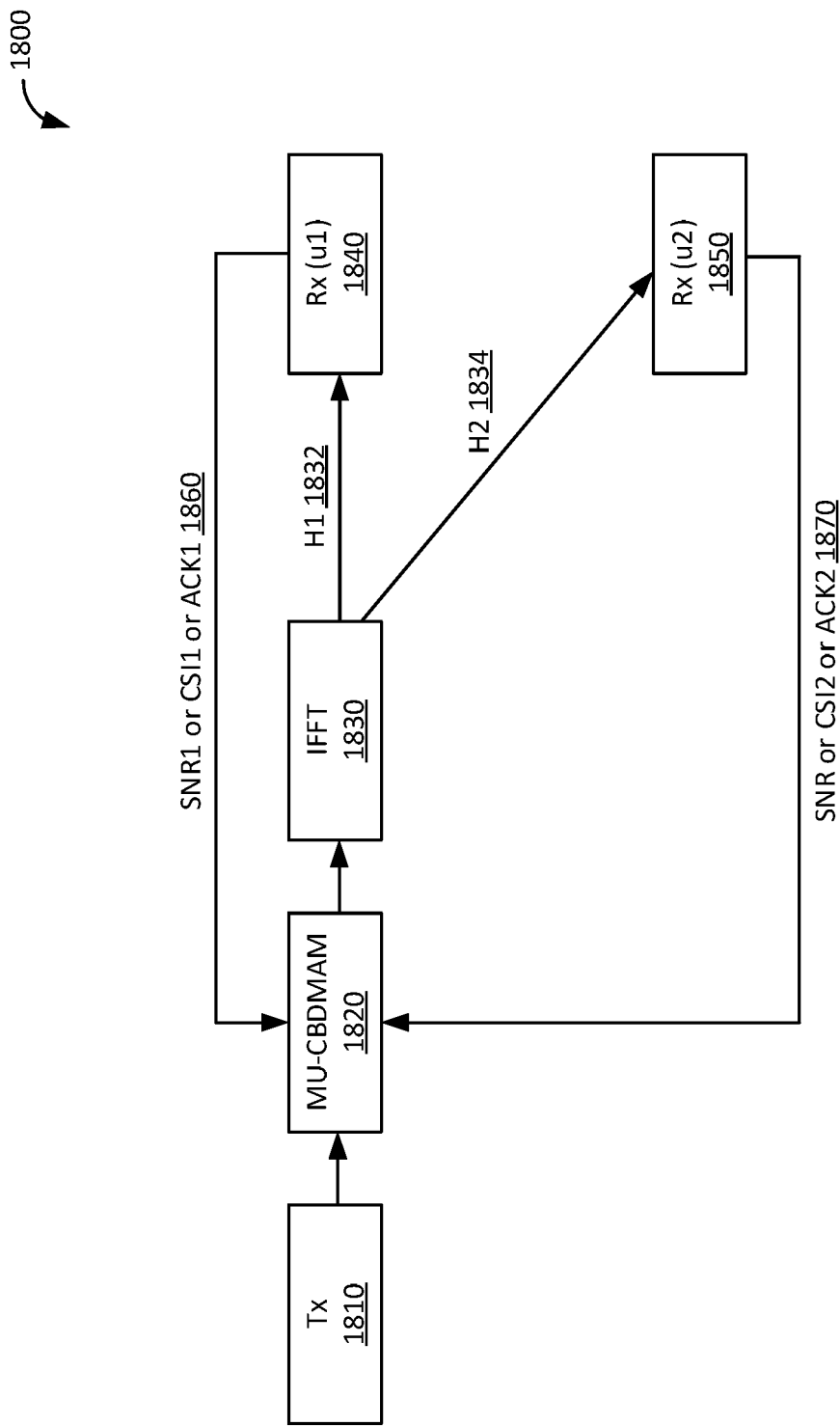
FIG. 18 is a block diagram of a non-limiting, exemplary modulator.

FIG. 18 illustrates exemplary system 1800 representing a system that includes CL MU-CBDMAM 1820. To provide equal error protection, CL MU-CBDMAM 1820 may select and map user 1's ("u1" in FIG. 18) bits 1840 to a first bit of I and Q branches. For example, CL MU-CBDMAM 1820 may map "I,1" if user 1 at 1860 is determined to have feedback with a low SNR1, a low CSI1, a low CQI1, and/or a NACK. CL MU-CBDMAM 1820 may select and map user 2's bits ("u2" in FIG. 18) 1850 to a second bit of I and Q branches. For example, CL MU-CBDMAM 1820 may map "Q,2" if user 2 at 1870 is determined to have a high SNR2, a high CSI2, a high CQI2, and/or an ACK. In exemplary system 1800, 1810 may represent blocks representing bits in a transceiver that may be provided to MU-CBDMAM 1820. IFFT 1830 may represent an applied inverse fast Fourier transform that may convert a frequency domain signal to a time domain. The blocks including 1810, 1820 and 1830 may be performed at a transmitter or a transceiver. H1 and H2 may represent fading channels, where Rx(u1) 1840 and Rx(u2) 1850 may be receivers or transceivers at two users (u1 and u2, respectively) on such channels.

Different sub-channels and/or different sub-carriers may have different levels of fading. Different modulation schemes may be used for each of such different sub-channels or sub-carriers. Such modulation schemes may be used for symbol sets with differing quantities of MU-CBDMAM transmissions.

Multi-user interleaving and multi-user modulation may be implemented together. While systems and methods that support multi-user interleaving in combination with multi-user modulation may be described herein, any aspect of the disclosed subject matter may be implemented individually or in combination with any one or more of any other aspects disclosed herein. The features of any embodiment described herein are independent and may be considered as individual elements of the embodiment.

One or more signals transmitted by a transceiver may provide control information to a receiver for de-interleaving and/or de-modulation. In order to support multi-user interleaving and/or multi-user modulation, e.g., in WiFi systems, a receiver may receive such control information that may indicate or otherwise allow the receiver to determine a multi-user interleaving and/or multi-user modulation scheme(s) used at a transceiver.

For example, information that may be determined by a receiver from a transceiver control signal may include a single bit that may indicate a virtual interleaver and/or separate interleavers by signaling a 1 or 0 (or a 0 or 1). Another bit received by a receiver may indicate MU-CBDMAM modulators or separate modulators by signaling a 1 or 0 (or 0 or 1). A receiver may also determine, in some examples from a transceiver control signal, a number of users (sub-channel or otherwise) that may be grouped into a virtual interleaver or an MU-CBDMAM.

A user selector control signal received by an MU-CBDMAM may be predefined, and/or may be known by both a transmitter of such a signal and a receiver of such a signal associated with an MU-CBDMAM. Such a control signal may be implicitly and/or explicitly signaled between a transmitter and receiver.

A selection of an open loop MU-CBDMAM or a closed loop MU-CBDMAM may be signaled to one or more multi-users. Multi-users' bits order and/or grouping may be provided to a virtual interleaver, e.g., using a control signal. An order of multi-users' bits, a bit selection, and/or a mapping of each multi-user's bits onto a constellation symbol may be signaled. Such information may be broadcast in a beacon, a short beacon, or any other type of management, control, or extension frame(s). Such information may be provided as part of a field, a subfield, and/or a subset of subfields of any information element (IE), or any combination thereof. Such information may be transmitted as a part of any control and/or management frame, in any MAC and/or physical layer convergence protocol (PLCP) header, and/or as part of any combination thereof.

Multi-user virtual interleaving and/or MU-CBDMAM operation information may be signaled by a PLCP header and/or a MAC layer header. A legacy header frame format for such headers may be used to, e.g., provide backwards compatibility. Reserved bit(s) and/or field(s) of such a legacy frame format may be reused to signal data representing multi-user virtual interleaving and/or MU-CBDMAM operation information. For example, a reserved bit (1 bit) after a rate field in a legacy PLCP header may be used to indicate whether support may be provided for virtual interleaving. Such bits and/or fields may be used to indicate whether support is provided for MU-CBDMAM. For example, a reserved bit in a PLCP header may be used to indicate if MU-CBDMAM may be supported. Virtual interleaver and/or MU-CBDMAM information may be signaled by one or more of reserved bits in, for example, a PLCP service field (e.g., bits 7 to 15) so that multiple selected stations may read, interpret, and/or derive virtual interleaver and/or MU-CBDMAM information to, for example, facilitate de-interleaving and de-modulation.

A field or bit in a PLCP header or a MAC header (that may be a new or previously unused field and/or bit in a respective header) may be used to signal multi-user virtual interleaving and/or MU-CBDMAM operation information. For example, a virtual interleaver field and/or an MU-CBDMAM field may be included in a signal (SIG) field of a PLCP header. Such a SIG field may include a bitmap of an index of sub-channel users grouped into a virtual interleaver or an MU-CBDMAM.

Multi-user virtual interleaving and/or MU-CBDMAM operation may be signaled by an IE. For example, a multi-user virtual interleaving element and/or an MU-CBDMAM element may be included as an IE and/or as one or more fields or subfields of an IE that may be implemented as an existing or new element, sub-element, or any management, control, or extension frame, or any combination thereof.

In an exemplary implementation, an element may signal multi-user virtual interleaving and/or MU-CBDMAM operation(s) related information by adding one or more new fields and/or subfields to a capabilities IE and/or by creating a new scrambling IE that may include some or all of possible multi-user virtual interleaving and/or MU-CBDMAM operation related information. The entirety or any portion of either or both of a disclosed element and disclosed fields and/or subfields may be present in a beacon, an association request, an association response, a reassociation request, a reassociation response, a probe request, a probe response frame, or any combination thereof.

A user selector control signal may be signaled in a PLCP header, and may be signaled in such a header using one or more signaling fields for an MU-CBDMAM modulator. For example, a user selector control signal may be signaled in a SIG-A signaling field, a SIG-B signaling field, or using both a SIG-A signaling field and a SIG-B signaling field of a PLCP header. A NUC or UC may be implicitly signaled by using auto-detection of IEEE 802.11 OFDMA packet classifications for an MU-CBDMAM modulator.

A feedback procedure may be employed to facilitate multi-user interleaving and/or modulation. During an OFDMA multi-user transmission opportunity (TXOP), an OFDMA AP may schedule a DL or an uplink (UL) transmission for one or more OFDMA STAs. One or more frames may be transmitted during the OFDMA TXOP to multiple OFDMA STAs. Any procedures, means, or methods set forth herein to support multi-user interleaving and/or multi-user modulation may be implemented separately or in any combination. Such aspects are contemplated as independent of other aspects and may be considered as individual aspects of the disclosed embodiments.

An OFDMA-capable AP may acquire and initiate an OFDMA TXOP for multi-user interleaving and/or modulation using a beacon with access parameters and/or a frame indicating access parameters. An OFDMA multi-user multi-frame transmission may occur after a OFDMA TXOP is initiated. The OFDMA AP may assign one or more sub-channels to different sub-channel STAs and/or may schedule a same or different MCSs to various sub-channel STAs. When "good" channel conditions are detected, some or all of the STAs may confirm such conditions using ACK frames that may be transmitted on the STAs respective assigned sub-channels as multiple simultaneous ACKs and/or sequential ACKs.

An OFDMA AP may increase an MCS for some or all STAs, increase an MCS for some or all STAs that may report a relatively higher CSI and/or SNR, increase an MCS for some or all STAs that may have a higher QoS requirement, switch from CL MU-CBDMAM to OL MU-CBDMAM if less feedback signaling may be desired, increase a total number of multi-users to be grouped into a virtual interleaver, or any combination thereof (e.g., to improve the system throughput).

Where poor channel conditions may be experienced, which may be indicated by one or more STAs failing to report ACK back to the OFDMA AP, an AP may send data again to one or more STAs that did not report ACK until the retransmission time achieves a maximum predetermined value. Such an AP may choose to schedule a same sub-channel and a same multi-user interleaving and/or modulation scheme for another STA. If there are no additional OFDMA STAs waiting for transmission, the AP may choose to use a narrow band or allocate a STA with ACK feedback to the entire bandwidth.

Where poor channel conditions may be experienced, an AP may transmit to a different group of one or more OFDMA STAs other than the one or more STAs of the multi-user group that was the intended recipient group of the transmission. Multi-user interleaving and/or modulation operations used by the AP may or may not be the same operations as those that may have been used in transmissions to the intended recipient multi-user group.

Where poor channel conditions may be experienced, a switch from OL MU-CBDMAM to CL MU-CBDMAM may be made. A "fail-to ACK" bit of one or more STAs that may have failed to send an ACK may be mapped to a higher level of a constellation symbol. STAs associated with "succeed-to-ACK" bit(s) may be mapped to a lower level of a constellation symbol.

Where CL MU-CBDMAM was used for a previous transmission, an OFDMA AP may continue to use CL MU-CBDMAM but may switch the more and less important levels of a constellation symbol between a "fail-to-ACK" STA's bits and a "succeed-to-ACK" STA's bits. An AP may select bits from a "succeed-to-ACK" STA to replace those of a mostly "fail-to-ACK" STA. An AP may replace a "fail-to-ACK" STA that has a low or lowest CSI and/or SNR with another STA that may not have been included in a previous or a recent transmission.

An AP may reduce a total number of sub-channel users grouped into a virtual interleaver relative to a previous transmission. For example, an AP may transmit to one STA using the entire available bandwidth and a virtual interleaver and MU-CBDMAM may fall back to an existing WiFi system.

Where all STAs may fail to report an ACK, an AP may switch a current TXOP to CSMA by transmitting an OFDMA TXOP end frame.

Figure 19:
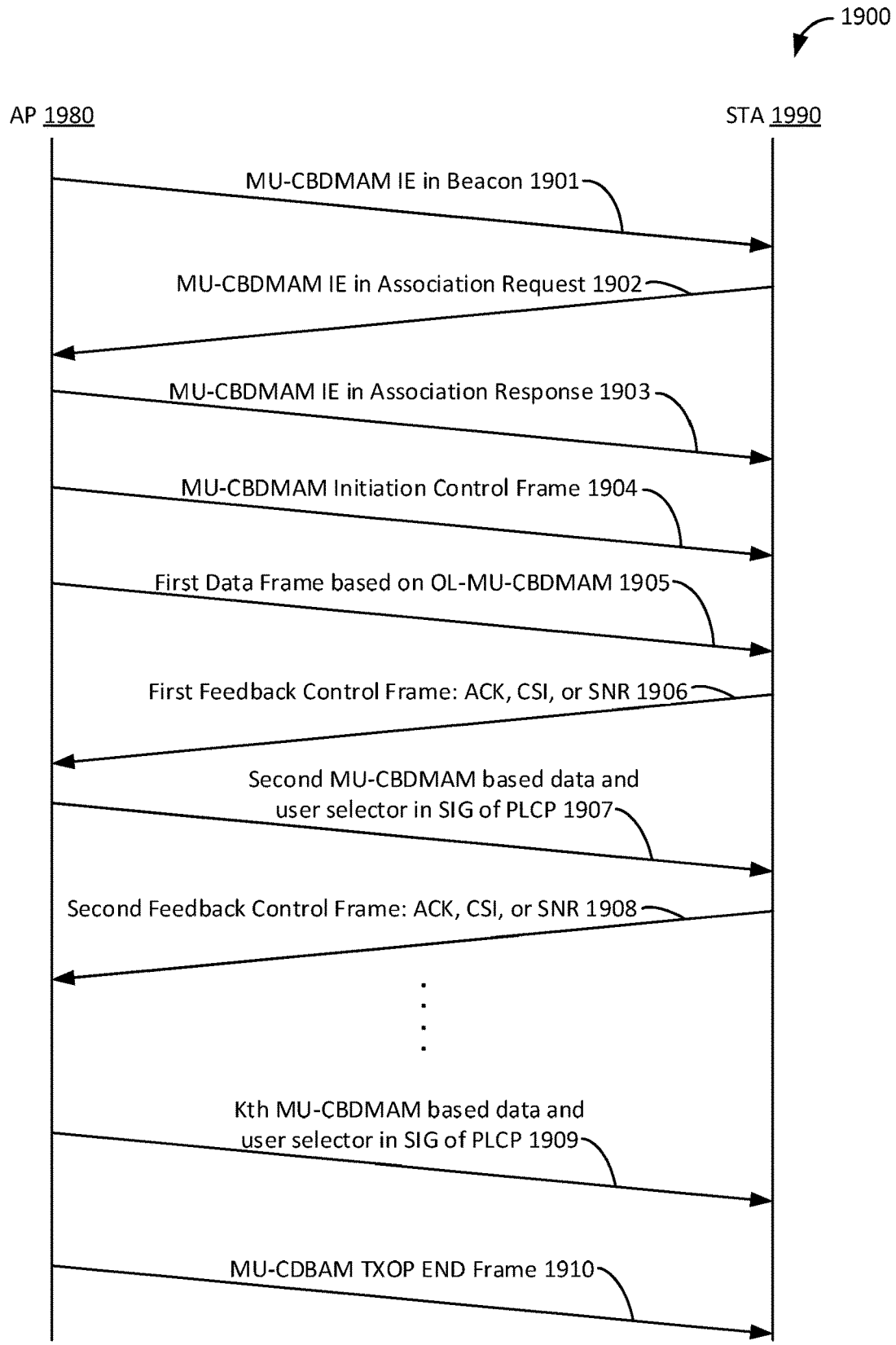
FIG. 19 is a block diagram illustrating a non-limiting, exemplary signal flow.

FIG. 19 shows a diagram of signal flow 1900 representing an exemplary MU-CBDMAM TXOP process. AP 1980 may be in communication with STA 1990. At 1901, AP 1980 may initialize an MU-CBDMAM capability exchange between AP 1980 and STA 1990 by sending an MU-CBDMAM IE in a beacon to STA 1990. STA 1990 may respond by transmitting an association request at 1902 that may include an MU-CBDMAM IE. AP 1980 may respond with feedback that may include an MU-CBDMAM IE in an association response at 1903.

At 1904, AP 1980 may send an MU-CBDMAM initiation control frame to STA 1990 to reserve an MU-CBDMAM TXOP.

AP 1980 may send to STA 1990 an initial data transmission including a first data frame based on OL MU-CBDMAM at 1905 if no channel condition related information is available. Upon receipt of the initial data transmission, STA 1990 may decode the transmission and feedback ACK, CSI, and/or SNR to AP 1980 by transmitting a first feedback control frame to AP 1980 at 1906.

AP 1980 may generate one or more constellation symbols using an MU-CBDMAM state machine, for example as shown in FIG. 17, and may send the one or more constellation symbols to STA 1990 at 1907. At 1907, AP 1980 may transmit MU-CBDMAM related data and a user selector signal in a SIG of a PLCP header. In response, STA 1990 may send a second feedback control frame that may include ACK, CSI, and/or SNR to AP 1980 at 1908. Any number of additional data and feedback frames may then be exchanged between AP 1980 and STA 1990. Note that one or any combination of ACK, CSI, and SNR may be used as feedback by an MU-CBDMAM state machine.

Upon completion of data transmissions at 1909, where AP 1980 may transmit $K^{th}$ MU-CBDMAM related data and/or a user selector signal to STA 1990, for example in a SIG of a PLCP header, or if one or more other conditions are met, (e.g., all STAs fail to report ACK to AP 1980), at 1910 AP 1980 may send an MU-CBDMAM TXOP END frame to STA 1990 that may switch MU-CBDMAM TXOP to CSMA.

Figure 20:
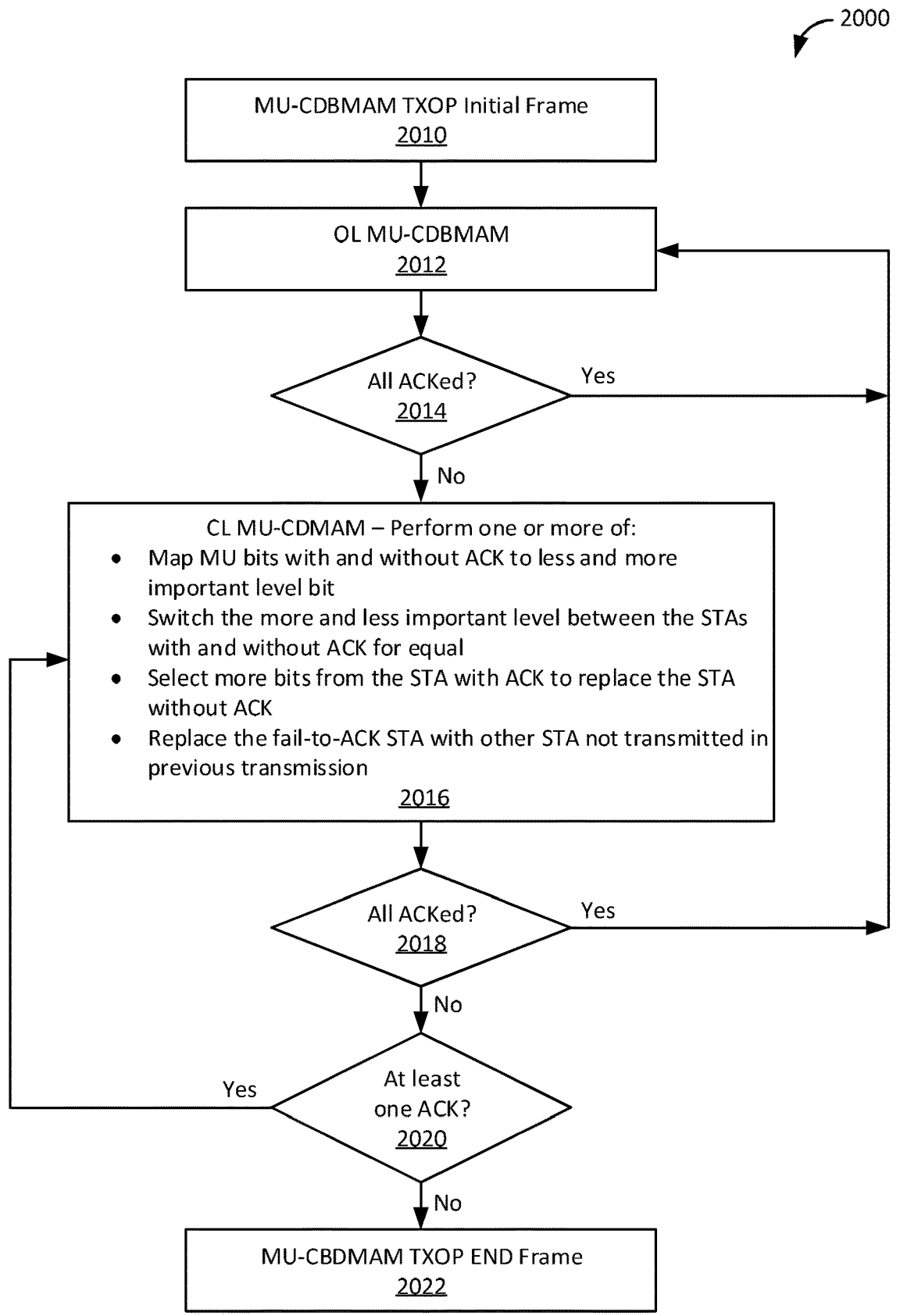
FIG. 20 is a block diagram illustrating a non-limiting, exemplary method.

FIG. 20 illustrates a block diagram representing exemplary method 2000 that may be performed in ACK-based MU-CBDMAM embodiments. At block 2010, after exchanging MU-CBDMAM capability information between an AP and at least one STA, (e.g., using a beacon and association request/response), an AP may initiate and reserve an MU-CBDMAM TXOP by sending an MU-CBDMAM TXOP initiation control frame as an initial frame. At block 2012, the AP may begin an initial data transmission based on OL MU-CBDMAM if no channel condition related information is available.

At block 2014, if all STAs successfully receive the first data transmission and feedback ACKs to the AP, the AP may determine that a channel condition is good or adequate, and may return to block 2012 to construct constellation symbols using OL MU-CBDMAM.

If, at block 2014, not all STAs indicate that they each have successfully received the first data transmission (e.g., not all STAs have fed back ACKs to the AP), the AP may determine that different STAs (or users) may be experiencing different channel conditions (e.g., one or more STAs may be experiencing poor channel conditions while one or more other STAs may be experiencing good channel conditions). In response, at block 2016 the AP may construct constellation symbols using CL MU-CBDMAM by using one or more of a variety of methods. An AP may utilize MU diversity gain and increase an information access probability by mapping MU bits with and without ACK to less and more important levels or switch more and less important levels between the STAs with and without ACK for equal bit allocation. A number of bits allocated to each user or to each user of a subset of users may be fixed.

At block 2016, the AP may attempt to obtain better frequency diversity gain by selecting more bits from a STA that provided an ACK to replace a STA that failed to ACK or replace a fail-to-ACK STA with another STA that was not transmitted to in the previous transmission.

At block 2018 the AP may determine whether all STAs have successfully received the data transmission based on CL MU-CBDMAMA by determining whether all the STAs have fed back ACKs to the AP. If so, the AP may continue constructing constellation symbols using CL MU-CBDMAM until all STAs feedback ACKs, at which point the AP may construct constellation symbols using OL MU-CBDMAM, returning to block 2012.

If it is determined at block 2018 that not all STAs reported ACK to the AP, the AP may determine, at block 2020, whether at least one ACK was received. If so, the AP may perform one or more of the functions of block 2016. If no ACKs have been received at the AP, the AP may send an MU-CBDMAM TXOP END frame to switch MU-CBDMAM TXOP to CSMA.

Although the features and elements described this disclosure are described using particular examples in particular combinations, each feature and element set forth herein may be used alone without the other features and/or elements of any of the disclosed examples. Each feature and element set forth herein may also be used with any one or more of the other features and/or elements of any of the disclosed examples.

The disclosed systems and methods may be used to facilitate OFDMA-based multiple access transmission and reception. While the instant disclosure may refer to an IEEE 802.11 specification and/or a subset thereof, the disclosed examples and description are not limited to systems, methods, or applications that implement, or are otherwise associated with, any aspect of the IEEE 802.11 specification.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed is:

1. A method for use in a device, the method comprising:
receiving a plurality of encoded bit streams, wherein each of the plurality of encoded bit streams is associated with one of a plurality of stations (STAs), wherein each of the plurality of STAs is associated with different subcarriers; and
transmitting a multiplexed bit stream for multi-user-multiple input multiple output (MU-MIMO) signal by interleaving the plurality of encoded bit streams and modulating the interleaved plurality of encoded bit streams such that a modulated Orthogonal Frequency-Division Multiple Access (OFDMA) symbol from the interleaved plurality of encoded bit streams includes a plurality of bits from an encoded bit stream associated with a first STA of the plurality of STAs and a plurality of bits from an encoded bit stream associated with a second STA of the plurality of STAs, wherein adjacent bits of the interleaved plurality of encoded bit streams are mapped onto non-adjacent subcarriers of the modulated OFDMA symbol.

2. The method of claim 1, further comprising:
grouping, based on a number of a plurality of STAs, the multiplexed bit stream into a plurality of interleaved bit substreams.

3. The method of claim 1, wherein the multiplexed bit stream is used for downlink MU-MIMO transmissions.

4. The method of claim 1, wherein the device is an access point (AP).

5. A device comprising:
at least one processor; and
a transceiver,
the at least one processor and the transceiver configured to:
receive a plurality of encoded bit streams wherein each of the plurality of encoded bit streams is associated with one of a plurality of stations (STAs), wherein each of the plurality of STAs is associated with different subcarriers ; and
transmit a multiplexed bit stream for multi-user-multiple input multiple output (MU-MIMO) signal by interleaving the plurality of encoded bit streams and modulating the interleaved plurality of encoded bit streams such that a modulated Orthogonal Frequency-Division Multiple Access (OFDMA) symbol from the interleaved plurality of encoded bit streams includes a plurality of bits from an encoded bit stream associated with a first STA of the plurality of STAs and a plurality of bits from an encoded bit stream associated with a second STA of the plurality of STAs, wherein adjacent bits of the interleaved plurality of encoded bit streams are mapped onto non-adjacent subcarriers of the modulated OFDMA symbol.

6. The device of claim 5, wherein the at least one processor and the transceiver are further configured to group, based on a number of the plurality of STAs, the multiplexed bit stream into a plurality of interleaved bit substreams.

7. The device of claim 5, wherein the multiplexed bit stream is used for downlink MU-MIMO transmissions.

8. The device of claim 5, wherein the device is an access point (AP).

9. An access point (AP) comprising:
at least one processor; and
a transceiver,
the at least one processor and the transceiver configured to:
receive a plurality of encoded bit streams, wherein each of the plurality of encoded bit streams is associated with one of a plurality of subcarricr users stations (STAs), wherein each of the plurality of STAs is associated with different subcarriers; and
transmit a multiplexed bit stream for multi-user-multiple input multiple output (MU-MIMO) signal by interleaving the plurality of encoded bit streams and modulating the interleaved plurality of encoded bit streams such that a modulated Orthogonal Frequency-Division Multiple Access (OFDMA) symbol from the interleaved plurality of encoded bit streams includes a plurality of bits from an encoded bit stream associated with a first STA of the plurality of STAs and a plurality of bits from an encoded bit stream associated with a second STA of the plurality of STAs, wherein adjacent bits of the interleaved plurality of encoded bit streams are mapped onto non-adjacent subcarriers of the modulated OFDMA symbol.

10. The AP of claim 9, wherein the at least one processor and the transceiver are further configured to group, based on a number of the plurality of STAs, the multiplexed bit stream into a plurality of interleaved bit substreams.

11. The AP of claim 9, wherein the multiplexed bit stream is used for downlink MU-MIMO transmissions.

* * * * *